United States Patent
Kim et al.

(10) Patent No.: US 7,075,847 B2
(45) Date of Patent: Jul. 11, 2006

(54) SEMICONDUCTOR MEMORY DEVICE HAVING OPTIMUM REFRESH CYCLE ACCORDING TO TEMPERATURE VARIATION

(75) Inventors: Se-Jun Kim, Ichon-shi (KR); Sang-Hoon Hong, Ichon-shi (KR); Jae-Bum Ko, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 39 days.

(21) Appl. No.: 10/877,886

(22) Filed: Jun. 23, 2004

(65) Prior Publication Data

US 2005/0185491 A1    Aug. 25, 2005

(30) Foreign Application Priority Data

Feb. 19, 2004  (KR) .................. 10-2004-0011063

(51) Int. Cl.
  *G11C 7/00*  (2006.01)
(52) U.S. Cl. ............... 365/222; 365/211; 365/212; 365/233; 327/512; 327/513
(58) Field of Classification Search .......... 365/222, 365/211, 212, 233; 327/512, 513
  See application file for complete search history.

(56) References Cited

U.S. PATENT DOCUMENTS

| | | | |
|---|---|---|---|
| 6,453,218 B1 * | 9/2002 | Vergis | 700/299 |
| 6,556,496 B1 * | 4/2003 | Benedix et al. | 365/222 |
| 6,809,978 B1 * | 10/2004 | Alexander et al. | 365/211 |

FOREIGN PATENT DOCUMENTS

| | | |
|---|---|---|
| JP | 06-162759 | 6/1994 |
| KR | 100200723 B1 | 3/1999 |

* cited by examiner

*Primary Examiner*—Connie C. Yoha
(74) *Attorney, Agent, or Firm*—Blakely Sokoloff Taylor & Zafman

(57) ABSTRACT

An apparatus for controlling a refresh cycle in a semiconductor memory device includes a temperature detection controller for generating a detection control signal and a converting control signal; a temperature detection block, which is enabled by the detection control signal, for generating an analog detection voltage in response to a temperature variation; an analog to digital converter, which is enabled by the converting control signal, for converting the analog detection voltage into a digital control code; and a refresh controller for generating a refresh cycle control signal based on the digital control code in order to control the refresh cycle.

37 Claims, 13 Drawing Sheets

SEMICONDUCTOR MEMORY DEVICE HAVING OPTIMUM REFRESH CYCLE ACCORDING TO TEMPERATURE VARIATION

FIELD OF INVENTION

The present invention relates to a semiconductor memory device; and, more particularly, to an apparatus for controlling a refresh cycle according to a temperature variation in the semiconductor memory device.

DESCRIPTION OF PRIOR ART

Generally, semiconductor memory device can be classified by Random Access Memory (hereinafter, referred as RAM) and Read Only Memory (hereinafter, referred as ROM). The RAM is volatile, but the ROM is nonvolatile. Namely, the ROM can keep stored data even though power supply is removed, but the RAM cannot keep stored data if the power supply is removed.

The RAM can be further classified by Dynamic Random Access Memory (hereinafter, referred as DRAM) and Static Random Access Memory (hereinafter, referred as SRAM). Each memory cell of the SRAM includes six transistors (or four transistors and two resistors) that constitute a latch for storing data. The latch can reserve the data as long as a power source is supplied. In contrast, the memory cell of the DRAM has one transistor and one capacitor for storing data. The DRAM data means the electrical charge in the capacitor, and the electrical charge amount is reduced in proportion to a data storing time. Therefore, the DRAM needs a periodic refresh operation that constantly refreshes the memory cells in order to maintain the stored data.

In addition, the DRAM receives a column address and a row address for selecting a memory cell. The row address is converted to a signal for selecting one of word lines included in the cell block and the column address is converted to a signal for selecting one of bit lines included in the cell block.

In the DRAM, one cycle of the refresh operation includes following steps: selecting the word line in the cell block; amplifying charge of stored data in the capacitors in response to the selected word line; and restoring the amplified data in the capacitors. Of course, the word lines are sequentially selected at every cycle of the refresh operation. Throughout the refresh operation, each charged data is restored in each memory cell without any loss.

In the refresh operation, the DRAM needs a refresh clock for selecting a different word line at every cycle. A refresh clock generator for the refresh operation is used in generating the refresh clock and the refresh operation is performed on the basis of the generated refresh clock.

FIG. 1 is a graph that presents the characteristic of a refresh period versus temperature of the semiconductor memory device.

As shown, the frequency of the refresh clock is varied in inverse proportion to the temperature. However, because stored charge leakage of the capacitor in the DRAM is increased in proportion to the temperature, this characteristic shown in FIG. 1 is ideal, not real. Actually, if the temperature is high, stored data in DRAM would loss quickly because of increasing charge leakage. If the temperature is low, stored data would be maintained for relatively long time because charge leakage is slowly occurred. Namely, the desired refresh period should be decreased in proportion to a temperature.

In a conventional DRAM, charge leakage may be largely increased in a high temperature because of the longer refresh frequency; and, for preventing a data loss, power consumption may be dramatically increased in a low temperature due to unnecessary refresh operation. Namely, it is always desired that the period of the refresh operation is decreased in proportion to the temperature.

For solving the above problem, for controlling a refresh period according to the temperature, a temperature detection circuit is provided in the conventional DRAM.

FIG. 2 is a block diagram showing a conventional semiconductor memory device having a refresh control block for adjusting a refresh cycle according to a temperature variation.

As shown, the conventional semiconductor memory device includes a temperature detection block 10, a refresh controller 20 and a memory core block 30.

The temperature detection block 10 receives a gauge signal A in order to sense a temperature variation in the conventional semiconductor memory device and selectively outputs one of a low temperature signal TL and a high temperature signal TH to the refresh controller 20 based on a sensed temperature. According to an outputted signal of the temperature detection block 10, the refresh controller 20 outputs a refresh reference signal Ref to the memory core block 30. Herein, the memory core block 30 having a plurality of unit cells performs a refresh operation in response to the refresh reference signal Ref.

FIG. 3 is a schematic diagram describing the temperature detection block 10 shown in FIG. 1.

As shown, the temperature detection block 10 includes a first delay block 11, a second delay block 12 and a signal generating block 13.

In detail, the first delay block 11 is constituted with a plurality of inverters; and the second delay block 12 has a plurality of inverter and resister pairs. Thus, with the temperature variation, a delay value of the first delay block 11 is longer or shorter than that of the second delay block 12. Namely, the delay value of the first delay block 11 is more relatively fluctuated, i.e., easily varied, than that of the second delay block 12.

According to the sensed temperature, the first and second delay blocks 11 and 12 respectively generate first and second reflect signals TSD and TISD to the signal generating block 13. An operation of the signal generating block 13 is described in detail, referring to FIGS. 4A and 4B.

FIGS. 4A and 4B are waveforms demonstrating an operation of the temperature detection block 10 shown in FIG. 3.

First of all, the gauge signal A is inputted to the temperature detection block 10. As shown in FIG. 4A, if the first reflect signal TSD is a logical high state and the second reflect signal TISD is a logical low state, the high temperature signal TH is a logical high state. In detail, with a high temperature, the delay value of the first delay block 11 is smaller than that of the second delay block 12. Namely, with the high temperature, after the gauge signal A becomes a logical high state, the first reflect signal TSD becomes a logical high state faster than the second reflect signal TISD does. As a result, if a temperature in the conventional memory device is high, the high temperature signal TH is a logical high state when the first reflect signal TSD is a logical high state and the second reflect signal TISD is a logical low state.

Otherwise, with a low temperature, the temperature detection block 10 outputs the low temperature signal having a logical high state to the refresh controller 20. Referring to FIG. 4B, if the first reflect signal TSD is a logical low state and the second reflect signal TISD is a logical high state, the low temperature signal TL is a logical high state. In detail, with a low temperature, the delay value of the second delay block 12 is smaller than that of the first delay block 11. Namely, with the low temperature, the first reflect signal TSD becomes a logical high state slower than the second reflect signal TISD does, after the gauge signal A becomes a logical high state. As a result, if a temperature in the conventional memory device is low, the low temperature signal TL is a logical high state.

However, as above described in the conventional semiconductor memory device, the temperature detection block 10 can determines that the temperature is high or low. As a result, there are three modes of the first and second reflect signals TL and TH outputted from the temperature detection block 10: first is (0, 0), i.e., TH-low and TL-low; second is (0, 1), i.e., TH-low and TL-high; and third is (1, 0), i.e., TH-high and TL-low.

Thus, the refresh controller 20 can adjust a refresh operation in three modes. Namely, the refresh controller 20 cannot control the refresh operation in response to a minute temperature variation.

In addition, the first and second reflect signals TH and TL are determined by an operation speed difference, i.e., a delay amount difference, between the resister and the inverter in response to the temperature variation. Because the operation speed difference is actually appeared in response to about 30° C. to about 50° C. range of the temperature variation, the refresh operation cannot be minutely and accurately controlled by the refresh controller 20.

On the other hand, the conventional semiconductor memory device is generally used in a normal temperature, i.e., a predetermined range of the temperature variation. Herein, the refresh controller 20 controls the refresh operation based on the temperature variation detected by the temperature detection block 10. As a result, if above described temperature detection block 10 cannot sense a temperature variation, the refresh operation controlled by the refresh controller 20 is not changed, e.g., the refresh cycle is not varied. In conclusion, it is not achieved that, for reducing power consumption, an unnecessary refresh operation is eliminated in response to the temperature variation. Also, because of the ineffective temperature detection block 10, a size of the conventional semiconductor memory device is increased.

SUMMARY OF INVENTION

It is, therefore, an object of the present invention to provide a semiconductor memory device having the optimum refresh cycle based on a temperature variation in order to reduce a power consumption.

In accordance with an aspect of the present invention, there is provided an apparatus for controlling a refresh cycle in a semiconductor memory device including a temperature detection controller for generating a detection control signal and a converting control signal; a temperature detection block, which is enabled by the detection control signal, for generating an analog detection voltage in response to a temperature variation; an analog to digital converter, which is enabled by the converting control signal, for converting the analog detection voltage into a digital control code; and a refresh controller for generating a refresh cycle control signal based on the digital control code in order to control the refresh cycle.

In accordance with another aspect of the present invention, there is provided a method for controlling a refresh cycle in response to a temperature variation, including steps of a) performing a refresh operation in response to a refresh control signal having a first period; b) sensing a temperature and generating an analog voltage based on the sensed temperature; c) converting the analog voltage into an N-bit digital control code; d) changing the first period of the refresh control signal into a second period in response to the N-bit digital control code; and e) performing the refresh operation in response to the refresh control signal having the second period.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an apparatus, which can control a refresh cycle in a semiconductor memory device, according to the present invention will be described in detail referring to the accompanying drawings.

Figure 1:
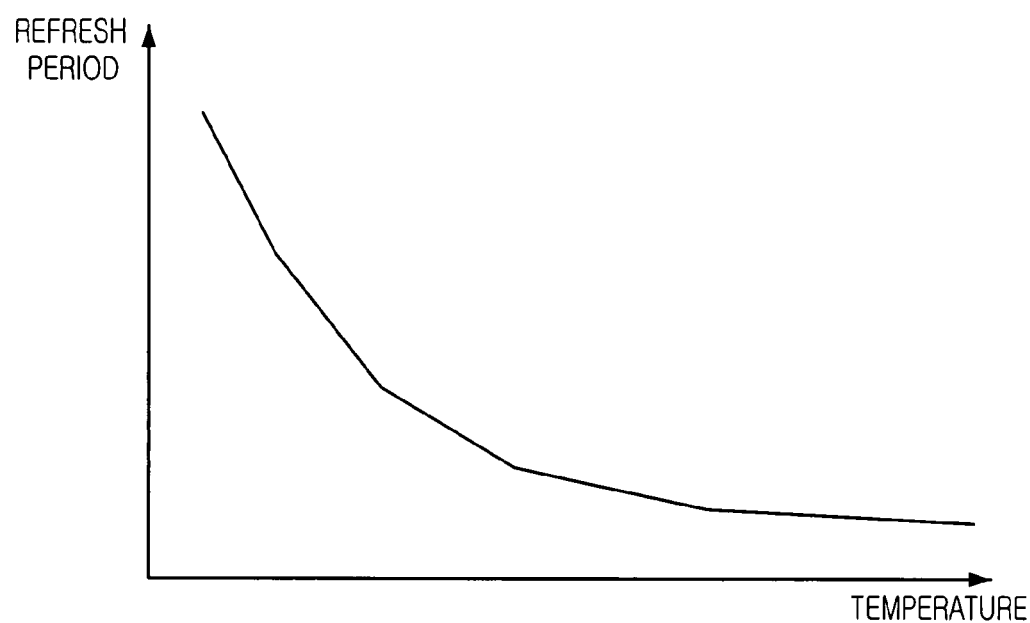
FIG. 1 is a graph that presents the characteristic of a refresh period versus temperature of the semiconductor memory device.
Figure 2:
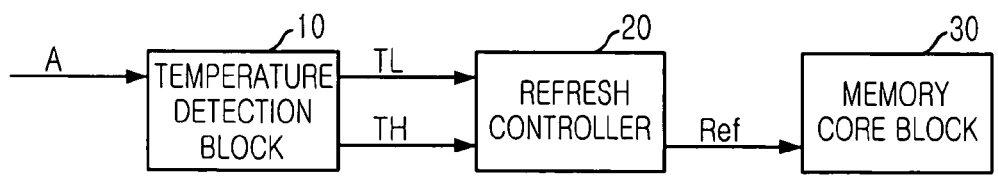
FIG. 2 is a block diagram showing a conventional semiconductor memory device having a refresh control block for adjusting a refresh cycle according to a temperature variation.
Figure 3:
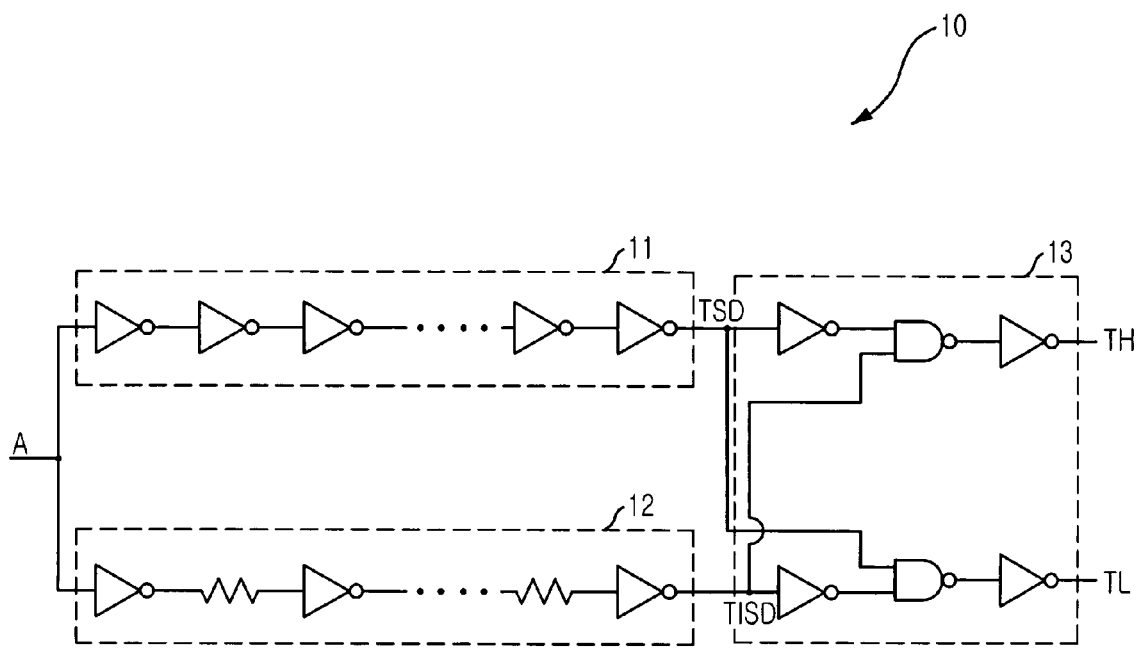
FIG. 3 is a schematic diagram describing a temperature detection block shown in FIG. 1.
Figure 4A:
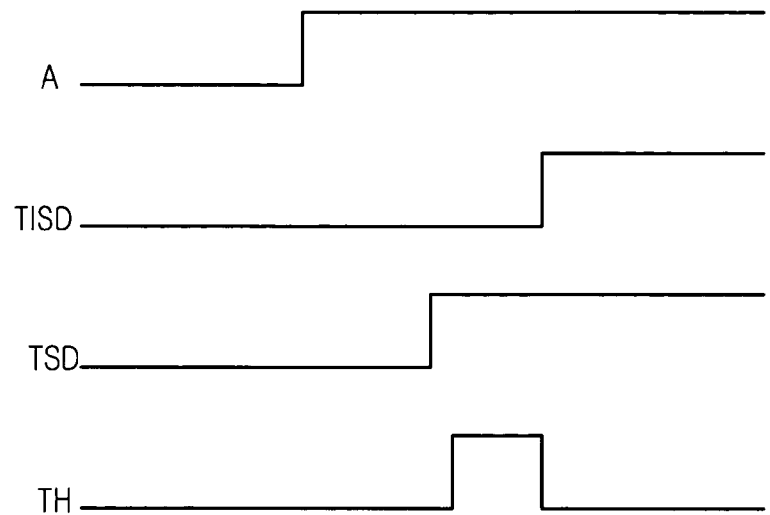
FIGS. 4A and 4B are waveforms demonstrating an operation of the temperature detection block shown in FIG. 3.
Figure 4B:
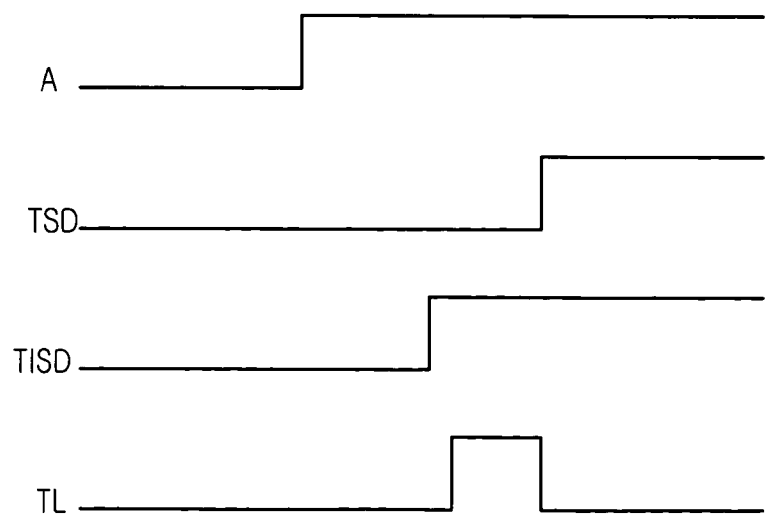
Figure 5:
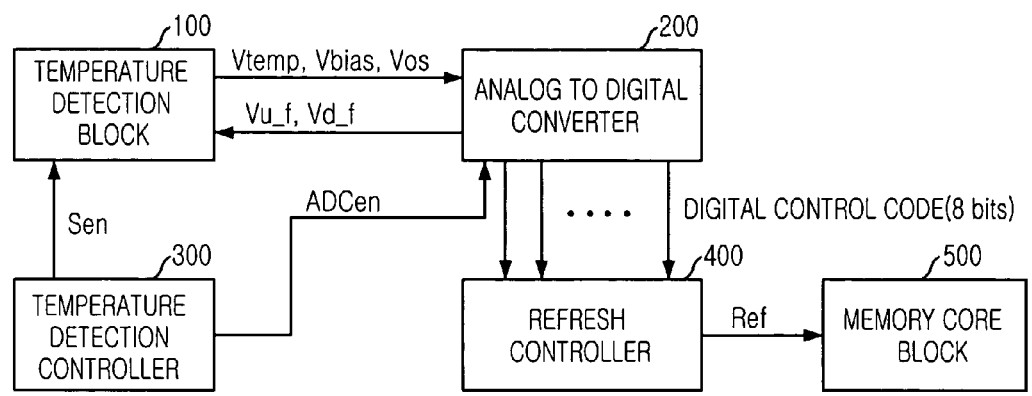
FIG. 5 is a block diagram showing a refresh cycle control block for controlling a refresh cycle in a semiconductor memory device in accordance with the present invention.

FIG. 5 is a block diagram showing a refresh cycle control block for controlling a refresh cycle in a semiconductor memory device in accordance with the present invention.

As shown, the semiconductor memory device includes a refresh cycle control block and a memory core block 500. The refresh cycle control block has a temperature detection block 100, an analog to digital converter 200, a temperature detection controller 300 and a refresh controller 400.

The temperature detection block 100, which is enabled by a detection control signal Sen, generates an analog detection voltage Vtemp in response to a temperature variation in the semiconductor memory device. The analog to digital converter 200, which is enabled by a converting control signal ADCen, converts the analog detection voltage Vtemp into a digital control code and thereby outputs the digital control code to the refresh controller 400; and outputs feedback high and low voltages Vd_f and Vu_f to the temperature detection block 100. Herein, the digital control code is 8-bits. The refresh controller 400 receives the digital control code outputted from the analog to digital converter 200 and generates a refresh cycle control signal Ref based on the digital control code in order to control the refresh cycle of the semiconductor memory device.

Herein, the detection control signal Sen and the converting control signal ADCen are outputted from the temperature detection controller 300. In detail, the temperature detection controller 300 outputs a detection control signal Sen to the temperature detection block 100. Herein, the detection control signal Sen is a kind of pulse. A period of the detection control signal Sen is determined by a circumference condition, e.g., a power, a temperature, a pressure, a manufacturing process, an employed application and the like. In addition, the detection control signal Sen is activated during a first predetermined duration in every period.

Herein, the first predetermined duration should be enough time for the temperature detection block 100 to check a temperature in the semiconductor memory device. In addition, the period of the detection control signal Sen is determined based on how often the temperature detection block 100 senses the temperature in the semiconductor memory device.

Moreover, the temperature detection controller 300 outputs the converting control signal ADCen to the analog to digital converter 200. The converting control signal ADCen enables the analog to digital converter 200 in order to convert the analog temperature voltage Vtemp into the digital control code.

Figure 6:
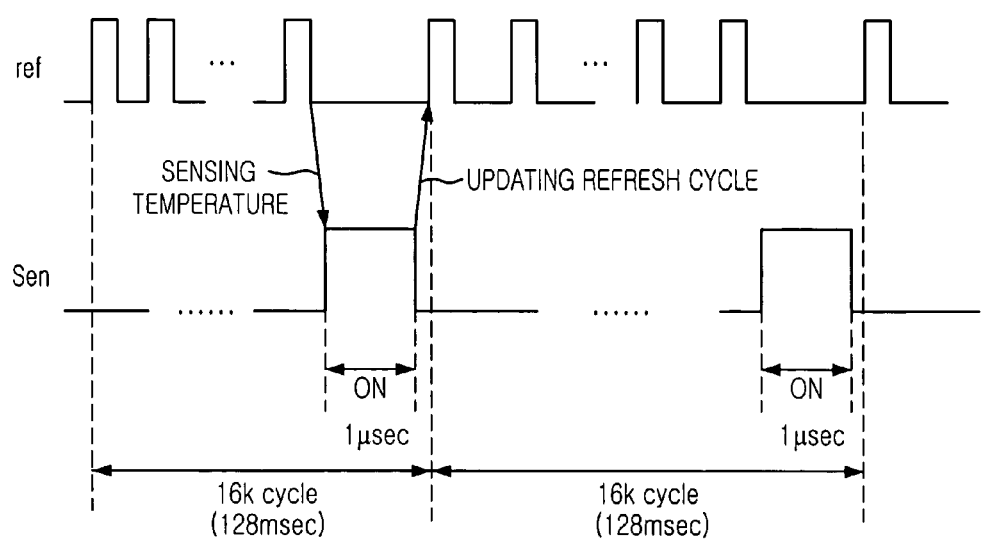
FIG. 6 is a waveform demonstrating an operation of the refresh cycle control block shown in FIG. 5.

FIG. 6 is a waveform demonstrating an operation of the refresh cycle control block shown in FIG. 5.

As shown, the semiconductor memory device carries out a refresh operation in response to the refresh cycle control signal ref. Herein, it is assumed that the semiconductor memory device has a 16 k refresh cycle. Typically, the 16 k refresh cycle is 128 μsec. The detection control signal Sen is activated for 1 μsec in the 16 k refresh cycle. It is because the 1 μsec, i.e., a duration of activating the detection control signal Sen, is enough time for the temperature detection block 100 to sense the temperature in the semiconductor memory device. In addition, during the 16 k refresh cycle in the semiconductor memory device, a temperature variation of the semiconductor memory device is usually under 1° C.

Thus, if the temperature detection block 100 is enabled for only 1 μsec, the semiconductor memory device employing the temperature detection block 100 can reduce a power consumption. Also, in order to reduce the power consumption, the analog to digital converter 200 is only enabled for receiving the analog temperature voltage Vtemp and converting the analog temperature voltage Vtemp into the digital control code.

Figure 7:
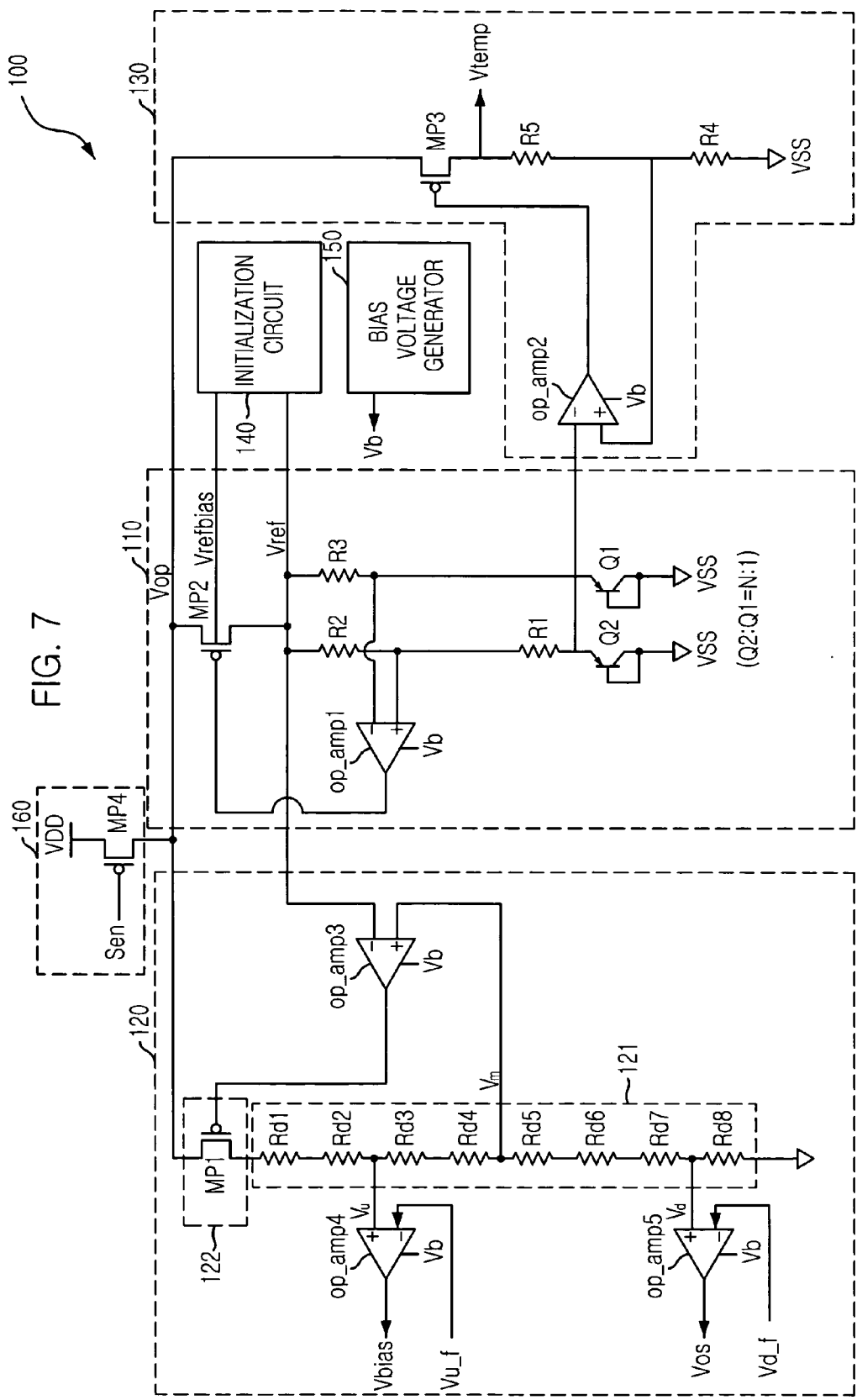
FIG. 7 is a schematic circuit diagram describing a temperature detection block shown in FIG. 5.

FIG. 7 is a schematic circuit diagram describing the temperature detection block 100 shown in FIG. 5.

As shown, the temperature detection block 100 includes a reference voltage generator 110, a bias voltage generator 120, a detection signal generator 130 and an enable block 160.

The reference voltage generator 110 is for outputting a reference voltage Vref, which has a fixed level in a temperature variation and a process variation by using a characteristic of a junction between an emitter and a base of a bipolar transistor and a characteristic of a thermal voltage, i.e., $VT=kT/q$, to the bias voltage generator 120. The bias voltage generator 120 generates a bias voltage Vbias and an offset voltage Vos used as references for converting the analog temperature voltage Vtemp into the digital control code in the analog to digital converter 200. The detection signal generator 130 coupled to the reference voltage generator is for generating the analog temperature voltage Vtemp. The enable block 160 is for enabling the bias voltage generator 120, the detection signal generator 130 and the reference voltage generator 110 in response to the detection control signal Sen. Herein, the enable block 160 has a fourth MOS transistor MP4 having a source, a gate and a drain, wherein the source is coupled to a power voltage VDD; the gate receives the detection control signal Sen; and the drain is for outputting an operation voltage Vop to the bias voltage generator 120, the detection signal generator 130 and the reference voltage generator 110.

Moreover, the temperature detection block 100 shown in FIG. 5 further includes an initialization circuit 140 for outputting the reference voltage Vref to the reference voltage generator 110 and a bias voltage generator 150 for supplying an op_amp bias voltage Vb to each operation amplifier, e.g., op_amp1, included in the temperature detection block 100.

Hereinafter, referring to FIG. 7, each structure of the bias voltage generator 120, the detection signal generator 130 and the reference voltage generator 110 is described in detail.

First, the reference voltage generator 110 includes first and second bipolar transistors Q1 and Q2, first to third resistors R1 to R3, a second MOS transistor MP2 and a first operation amplifier op_amp1.

As shown in FIG. 7, the second MOS transistor MP2 has a source, a gate and a drain, wherein the source receives the operation voltage Vop and the drain receives the reference voltage Vref which is outputted from the initialization circuit 140. The drain of the second MOS transistor MP2 is coupled to each one side of the second and third resistors R2 and R3. The other side of the second resistor R2 is coupled to one side of the first resistor R1. Also, input terminals of the first operation amplifier op_amp1 is coupled to each the other side of the second and third resistors R2 and R3; and its output terminal is coupled to the gate of the second MOS transistor MP2. The first bipolar transistor Q1 has an emitter, a base and a collector, wherein the emitter is coupled to the other side of the third resistor R3 and the base connected to the collector is coupled to a ground VSS. The second bipolar transistor Q2 has an emitter, a base and a collector, wherein the emitter is coupled to the other side of the first resistor R1 and the base connected to the collector is coupled to a ground VSS.

Next, the detection signal generator 130 includes a third MOS transistor MP3, a second operation amplifier op_amp2 and fourth and fifth resistors R4 and R5. The third MOS transistor MP3 has a source, a gate and a drain, wherein the source receives the operation voltage Vop. The second operation amplifier op_amp2 receives two voltages, wherein one is a voltage supplied between the first resistor R1 and the second bipolar transistor Q2 in the reference voltage generator 110 and the other is a voltage supplied between the fourth and fifth resistors R4 and R5; and its output terminal is coupled to the gate of the third MOS transistor MP3. One side of the fifth resistor R5 is coupled to the drain of the third MOS transistor MP3 and the other side of the fifth resistor R5 is coupled to one side of the fourth resistor R4. The other side of the fourth resistor R4 is coupled to the ground VSS.

The bias voltage generator 120 includes a first MOS transistor MP1, a voltage dividing block 121 and third to fifth operation amplifiers op_amp3 to op_amp5. Herein, the voltage dividing block 121 has serially connected eight dividend resistors Rd1 to Rd8.

The first MOS transistor MP1, i.e., a voltage supplier 122, has a source, a gate and a drain, wherein the source receives the operation voltage Vop and the drain is coupled to the voltage dividing block 121. The third operation amplifier op_amp3 receives the reference voltage signal Vref outputted from the reference voltage generator 110 and a middle dividend voltage Vm outputted from the voltage dividing block 121. An output terminal of the third operation amplifier op_amp3 is coupled to the gate of the first MOS transistor MP1. The fourth operation amplifier op_amp4 receives an up dividend voltage Vu and the feedback high voltage Vu_f to thereby output the bias voltage Vbias. The fifth operation amplifier op_amp5 receives a down dividend voltage Vd and the feedback low voltage Vd_f to thereby output the offset voltage Vos. Herein, the up, middle and down dividend voltages Vu, Vm, and Vd are outputted from the voltage dividing block 121. Particularly, the up dividend voltage Vu is outputted between the second dividend resistor Rd2 and the third dividend resistor Rd3; the middle dividend voltage Vm is outputted between the fourth dividend resistor Rd4 and the fifth dividend resistor Rd5; and the down dividend voltage Vd is outputted between the seventh dividend resistor Rd7 and the eighth dividend resistor Rd8.

Figure 8:
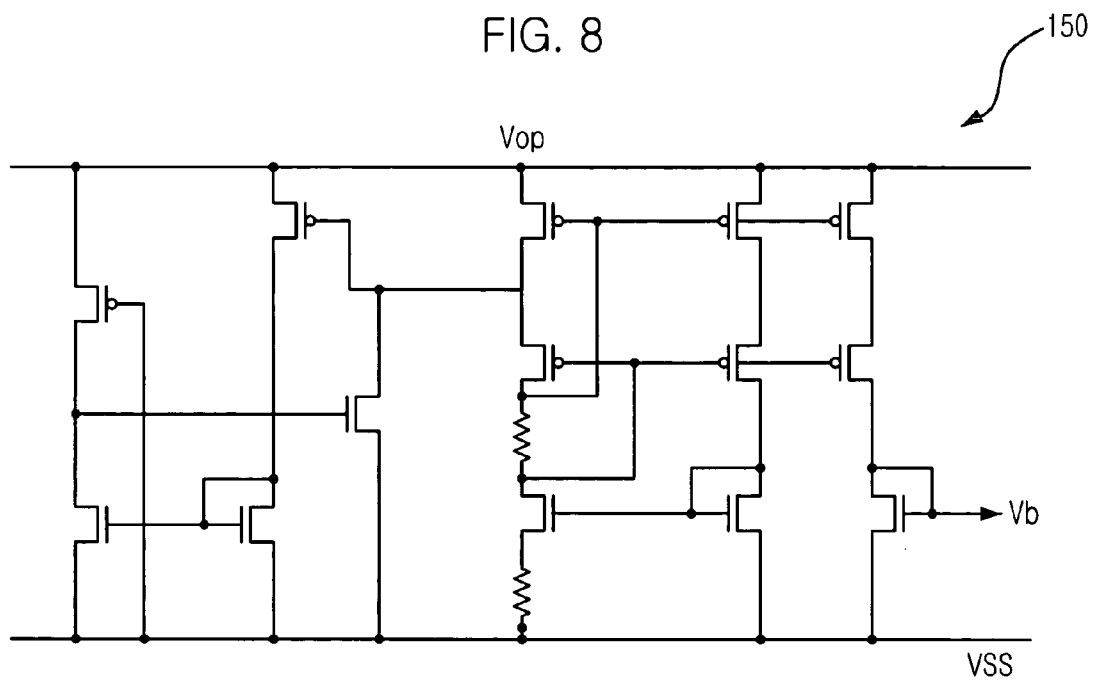
FIG. 8 is a schematic circuit diagram describing a bias voltage generator shown in FIG. 7.

FIG. 8 is a schematic circuit diagram describing the bias voltage generator 150 shown in FIG. 7.

As shown, the bias voltage generator 150 includes a plurality of MOS transistors coupled between the operation voltage Vop and the ground VSS in order to generate an op_amp bias voltage Vb for operating the first to fifth operation amplifiers op_amp1 to op_amp5.

Figure 9:
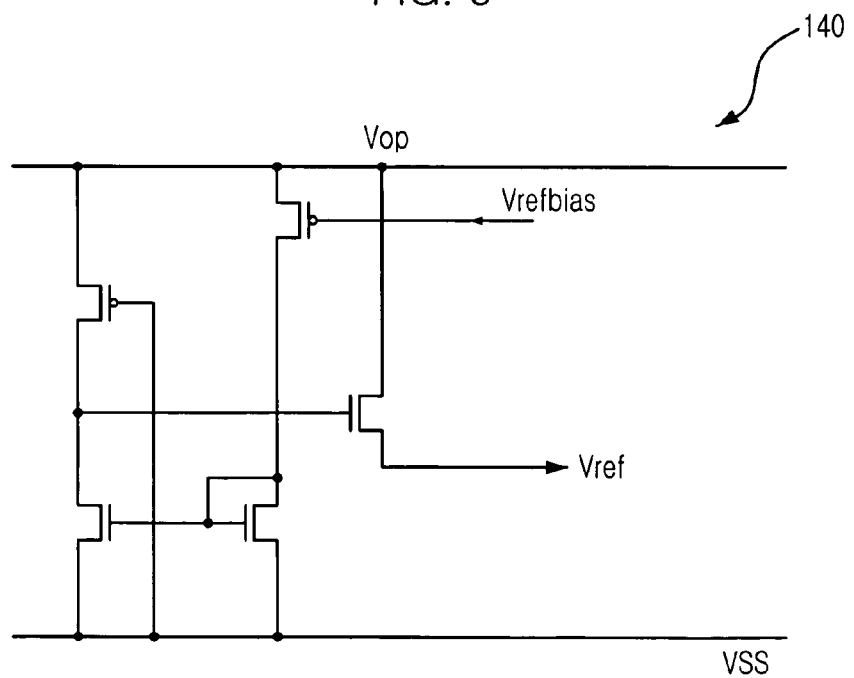
FIG. 9 is a schematic circuit diagram depicting an initialization block shown in FIG. 7.

FIG. 9 is a schematic circuit diagram depicting the initialization block 140 shown in FIG. 7.

As shown, the initialization block 140 includes a plurality of MOS transistors. After the operation voltage Vop is supplied, the initialization block 140 generates the reference voltage Vref over a predetermined level. Namely, the initialization block 140 is for increasing a voltage level of the reference voltage Vref over the predetermined level in order to prevent an error which can be occurred in the reference voltage generator 110.

For example, in the reference voltage generator 110, if two ground level voltages are inputted to the first operation amplifier op_amp1, an output of the first operation amplifier op_amp1 is not changed. Thus, there is occurred the error that the reference voltage generator 110 is not operated anymore. In addition, the error is occurred when two voltages inputted to the first operation amplifier op_amp1 has the same ground level after the operation voltage Vop is supplied. Thus, the reference voltage Vref should be supplied over the predetermined level to the reference voltage generator 110. Herein, the initialization circuit 140 is disabled in response to a reference bias signal Vrefbais, i.e., output voltage of the first operation amplifier op_amp1.

Figure 10:
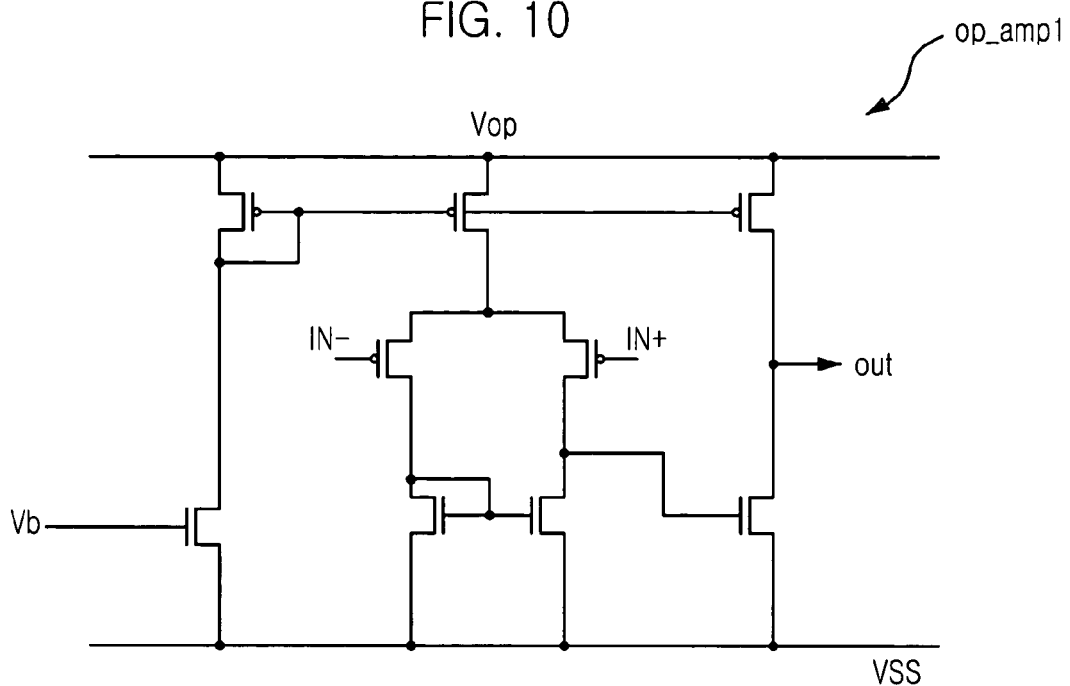
FIG. 10 is a schematic circuit diagram showing each of first to fifth operation amplifiers shown in FIG. 7.

FIG. 10 is a schematic circuit diagram showing each of the first to fifth operation amplifiers op_amp1 to op_ampe5 shown in FIG. 7.

As shown, each operation amplifier, which is enabled based on the op_amp bias voltage Vb, receives two inputted voltages IN− and IN+ to thereby output an output voltage OUT in response to a difference between two inputted voltages IN− and IN+.

Figure 11:
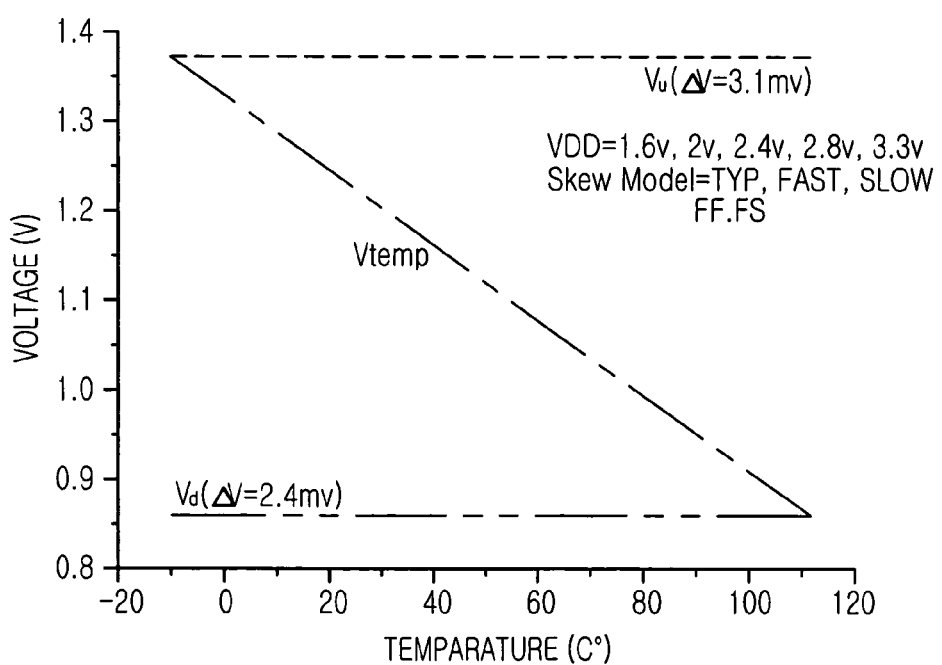
FIG. 11 is a waveform demonstrating an operation of the temperature detection block shown in FIG. 7.

FIG. 11 is a waveform demonstrating an operation of the temperature detection block 100 shown in FIG. 7. Hereinafter, referring to FIGS. 7 to 11, the operation of the temperature detection block 100 is described in detail.

First of all, the reference voltage generator 110 generates the reference voltage Vref which does not undergo a manufacturing process, a temperature variation and an operation voltage. Namely, a voltage level of the reference voltage Vref is almost never changed in response to the manufacturing process, the temperature variation and the operation voltage.

If the operation voltage Vop is supplied to the initialization circuit 140, the reference voltage Vref is increased to a predetermined voltage level. Then, the first operation amplifier op_amp1 outputs the reference bias signal Vrefbais to the gate of the second MOS transistor MP2 and the initialization circuit 140. If the second MOS transistor MP2 is turned on, a current is supplied to the first to the third resistors R1 to R3.

Herein, according to two inputted voltages, the voltage level of the reference bias signal Vrefbais is determined. Then, the second MOS transistor MP2 controlled by the reference bias signal Vrefbais, which is outputted from the first operation amplifier op_amp1, controls adjusts amount of a first current flowing through the first to third resistors R1 to R3. If the first operation amplifier op_amp1 receives two same inputted voltages, the second MOS transistor MP2 is turned off; then, the voltage level of the reference voltage Vref is not changed anymore.

Hereinafter, when the first operation amplifier op_amp1 receives two same inputted voltages, how to generate the reference voltage Vref which does not undergo a temperature is described in detail. The voltage level of the reference voltage Vref is calculated by using following equations.

First, an amount of current flowing through the first or second bipolar transistors Q1 and Q2 can be defined as following equation Eq. 1.

$$I = I_s e^{V_{be}/VT}$$ [Eq. 1]

Herein, VT is a thermometer voltage.

Also, the thermometer voltage VT is defined as kT/q. Herein, k is a bolzamann constant; q is quantity of electronic charge; and T is an absolute temperature.

Continuously, if two inputted voltages of the first operation amplifier op_amp have the same voltage level, a current flowing throughout the first resistor R1 is defined as following equation Eq. 2.

$$I = (V_{be1} - V_{be2})/R1 \quad [\text{Eq. 2}]$$

On the other hand, if ratio between the first and second bipolar transistors Q1 and Q2 is N:1 (N is a positive constant), each current flowing throughout the first and second bipolar transistors Q1 and Q2 is defined as following equation Eq. 3.

$$I_{Q1} = I_s e^{Vbe1/VT}, \; I_{Q2} = N \times I_s e^{Vbe2/VT} \quad [\text{Eq. 3}]$$

Herein, it is assumed that two inputted voltages of the first operation amplifier op_amp have the same voltage level, i.e., $I_{Q1} \times R3 = I_{Q2} \times R2$. Namely, $I_{Q1}/I_{Q2} = R2/R3$. As a result, a relationship between each base to emitter voltage $V_{be1}$ and $V_{be2}$ is defined as following equation Eq. 4.

$$V_{be1} - V_{be2} = VT \times \ln(N \times R2/R3) \quad [\text{Eq. 4}]$$

Then, the reference voltage Vref is defined as following equation Eq. 5.

$$Vref = V_{be1} + (R2/R1) \times VT \times \ln(N \times R2/R3) \quad [\text{Eq. 5}]$$

Referring to Eq. 5, $V_{be1}$ is in inverse proportion with a temperature. Its proportional constant is about −2.1 mV/° C. But, VT has a positive proportional constant. That is, if $(R2/R1) \times \ln(N \times R2/R3)$ is properly controlled, the reference voltage Vref can have a constant voltage level with a temperature variation.

On the other hand, the detection signal generator 130 receives the emitter to base voltage $V_{be2}$ of the second bipolar transistor Q2 and amplifies the emitter to base voltage $V_{be2}$ by a predetermined gain. Herein, because the proportional constant of the emitter to base voltage $V_{be2}$ is too small, e.g., −2.1, it is difficult to minutely and accurately detect the temperature variation without amplifying the emitter to base voltage $V_{be2}$. Referring to FIG. 7, as using the operation voltage Vop supplied to the detection signal generator 130, the emitter to base voltage $V_{be2}$ is amplified by (R4+R5)/R4. As a result, the analog temperature voltage Vtemp is defined as following equation Eq. 6.

$$Vtemp = (V_{be2}/R4) \times (R4+R5) \quad [\text{Eq. 6}]$$

Meanwhile, for amplifying the analog temperature voltage Vtemp by a predetermined resistance ratio of the fourth and fifth resistors, the operation voltage Vop is used. Herein, for maximizing a sensitivity of the temperature by using a minimum operation voltage, e.g., under 1.6 V, a resistance ratio (R5:R4) between the fifth and fourth resistors R5 and R4 is about 2.013:1. Namely, in this case, a proportional constant of the analog temperature voltage Vtemp is about −4.25 mV/° C. Namely, if the temperature changes 1° C., the analog temperature voltage Vtemp decreases −4.25 mV. As the temperature goes up, the analog temperature voltage Vtemp is decreased.

Meanwhile, the bias voltage generator 120 receives the reference voltage Vref and generates the up and down dividend voltages Vu and Vd. Then, the bias voltage generator 120 compares the up dividend voltage Vu with the feedback high voltage Vu_f to thereby compensate and output the bias voltage Vbias; and compares the down dividend voltage Vd with the feedback low voltages Vd_f to thereby compensate and output the offset voltage Vos. Herein, the up and down dividend voltages Vu and Vd outputted from the voltage dividing block 121 included in the bias voltage generator 120 respectively mean a minimum temperature, i.e., about −10° C., and a maximum temperature, i.e about 110° C., which can be detected by the temperature detection block 100.

In addition, in response to the detection control signal Sen, the enable block 160 supplies the operation voltage Vop to the bias voltage generator 120, the detection signal generator 130 and the reference voltage generator 110.

Referring to FIG. 11, the more the temperature is increased, the more the analog temperature voltage Vtemp is decreased. Also, the up and down dividend voltages Vu and Vd outputted from the voltage dividing block 121 respectively have about 1.37 V and about 830 mV constant voltage levels without any influence of the temperature variation. However, for generating the bias voltage Vbias and the offset voltage Vos in response to each of the up and down dividend voltage Vu and Vd, the bias voltage generator 120 receives the feedback high and low voltage Vu_f and Vd_f outputted from the analog to digital converter 200.

As above described, it's important that the temperature detection block 100 outputs not only the analog temperature detection voltage Vtemp but also the bias voltage Vbias and the offset voltage Vos to the analog to digital converter 200. Herein, the analog temperature detection voltage Vtemp is not relatively sensitive against the temperature variation. For overcoming above disadvantage of the analog temperature detection voltage Vtemp, the temperature detection block 100 receives the feedback high voltage Vu_f and outputs the bias voltage Vbias after comparing the feedback high voltage Vu_f with the high dividend voltage Vu. Also, the temperature detection block 100 receives the feedback low voltage Vd_f and outputs the offset voltage Vos after comparing the feedback low voltage Vd_f with the low dividend voltage Vd. Because the temperature detection block 100 always generates the bias voltage Vbias and the offset voltage Vos respectively having newly compensated levels, the analog to digital converter 200 can more accurately convert the analog temperature detection voltage Vtemp into the 8-bit digital control code in response to the sensed temperature.

Figure 12:
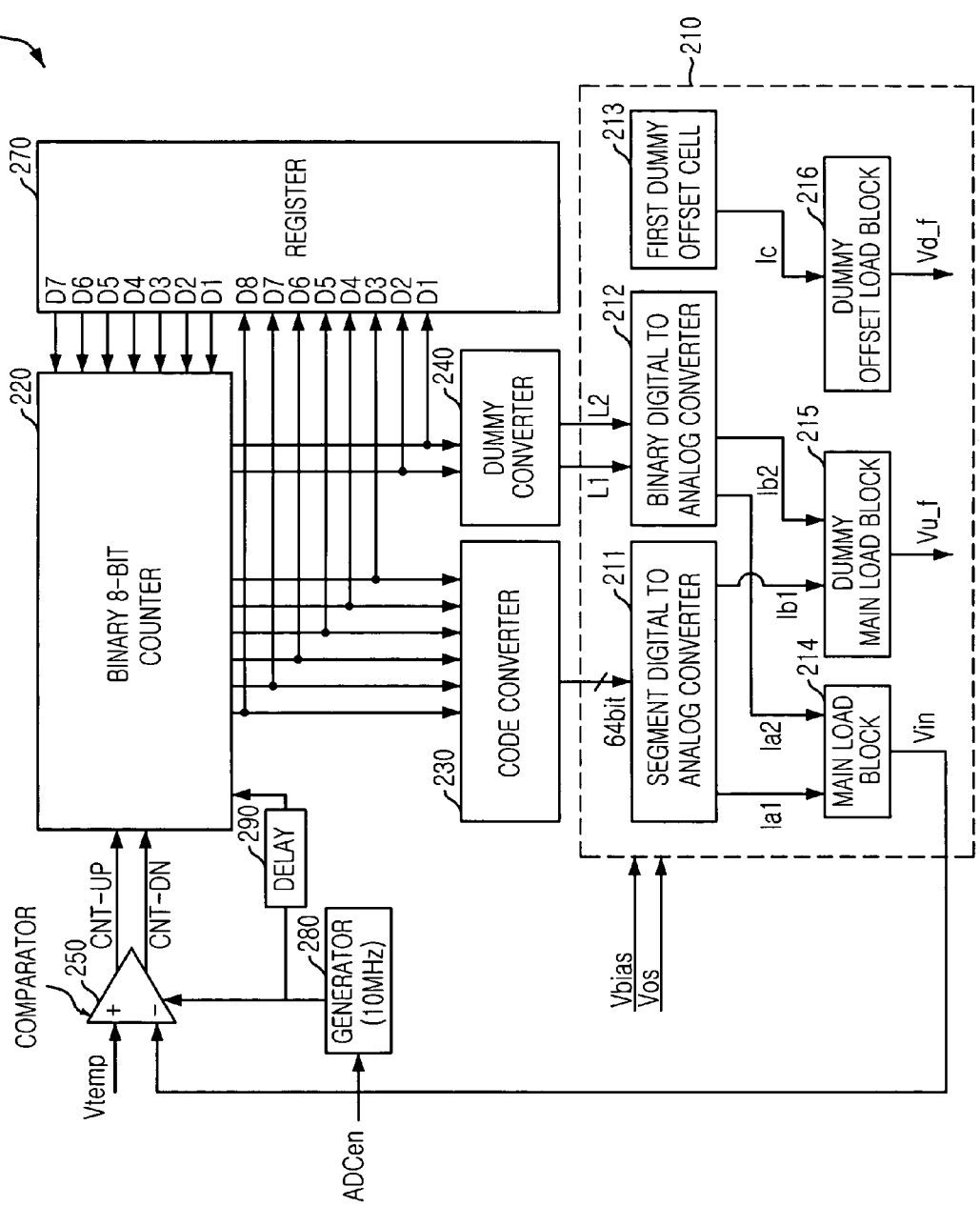
FIG. 12 is a block diagram describing an analog to digital converter shown in FIG. 5.

FIG. 12 is a block diagram describing the analog to digital converter 200 shown in FIG. 5.

As shown, the analog to digital converter 200 includes a voltage comparator 250, a binary 8-bit counter 220, a code converter 230, a dummy converter 240 and a digital to analog converting block 210.

The voltage comparator 250 is for comparing the analog temperature detection voltage Vtemp with a temperature range voltage Vin. According to above comparison result of the voltage comparator 250, the binary 8-bit counter 220 adjusts the digital control code. Herein, 6-bit code of the digital control code is inputted to the code converter 230; and the other, i.e., 2-bit code, of the digital control code is inputted to the dummy converter 240. Then, the code converter 230 converts the 6-bit code into a thermometric code. As shown, the thermometric code is 64-bit. Also, during duration of converting the 6-bit code into the thermometric code in the code converter 230, the dummy converter 240 receives the 2-bit code and delays the 2-bit code by a predetermined amount to thereby output as a 2-bit dummy digital code L1 and L2. The thermometric code and the 2-bit dummy digital code are inputted to the digital to analog converting block 210 and converted into the temperature range voltage Vin, the feedback high voltage Vu_f and the feedback low voltage Vd_f.

Referring to FIG. 12, the digital to analog converting block 210 includes a segment digital to analog converter 211, a binary digital to analog converter 212, a first dummy offset cell 213, a main load block 214, a dummy main load block 215 and a dummy offset load block 216.

The segment digital to analog converter 211 receives the thermometric code outputted from the code converter 230 and generates a first analog current Ia1 and a first dummy analog current Ib1. The binary digital to analog converter 212 receives the 2-bit dummy digital code L1 and L2 and generates a second analog current Ia2 and a second dummy analog current Ib2. Herein, the first and second analog currents Ia1 and Ia2 are inputted to the main load block 214 and converted into the temperature range voltage Vin; and the first and second dummy analog currents Ib1 and Ib2 are inputted to the dummy main load block 215 and converted into the feedback high voltage Vu_f.

In addition, the first dummy offset cell 213 generates a dummy offset current Ic in response to the offset voltage Vos. Then, the dummy offset load block 216 Vd_f generates the feedback low voltage Vd_f based on the dummy offset current Ic.

In addition, as shown in FIG. 12, the analog to digital converter 200 further includes a pulse generator 280, a delay block 290 and a register 270.

The pulse generator 280 generates a control pulse for determining an operation period of the voltage comparator 250. For example, in FIG. 12, a frequency of the control pulse is 10 MHz. Also, the pulse generator 280 is enabled by the converting control signal ADCen outputted from the temperature detection controller 300 shown in FIG. 5.

The delay block 290 is for delaying the control pulse by a predetermined amount, i.e., until the voltage comparator 250 outputs a count up signal CNT-UP and a count down signal CNT-DN based on the comparison result to the binary 8-bit counter 220.

The register 270 is for latching the thermometric code outputted from the binary 8-bit counter 220.

Figure 13:
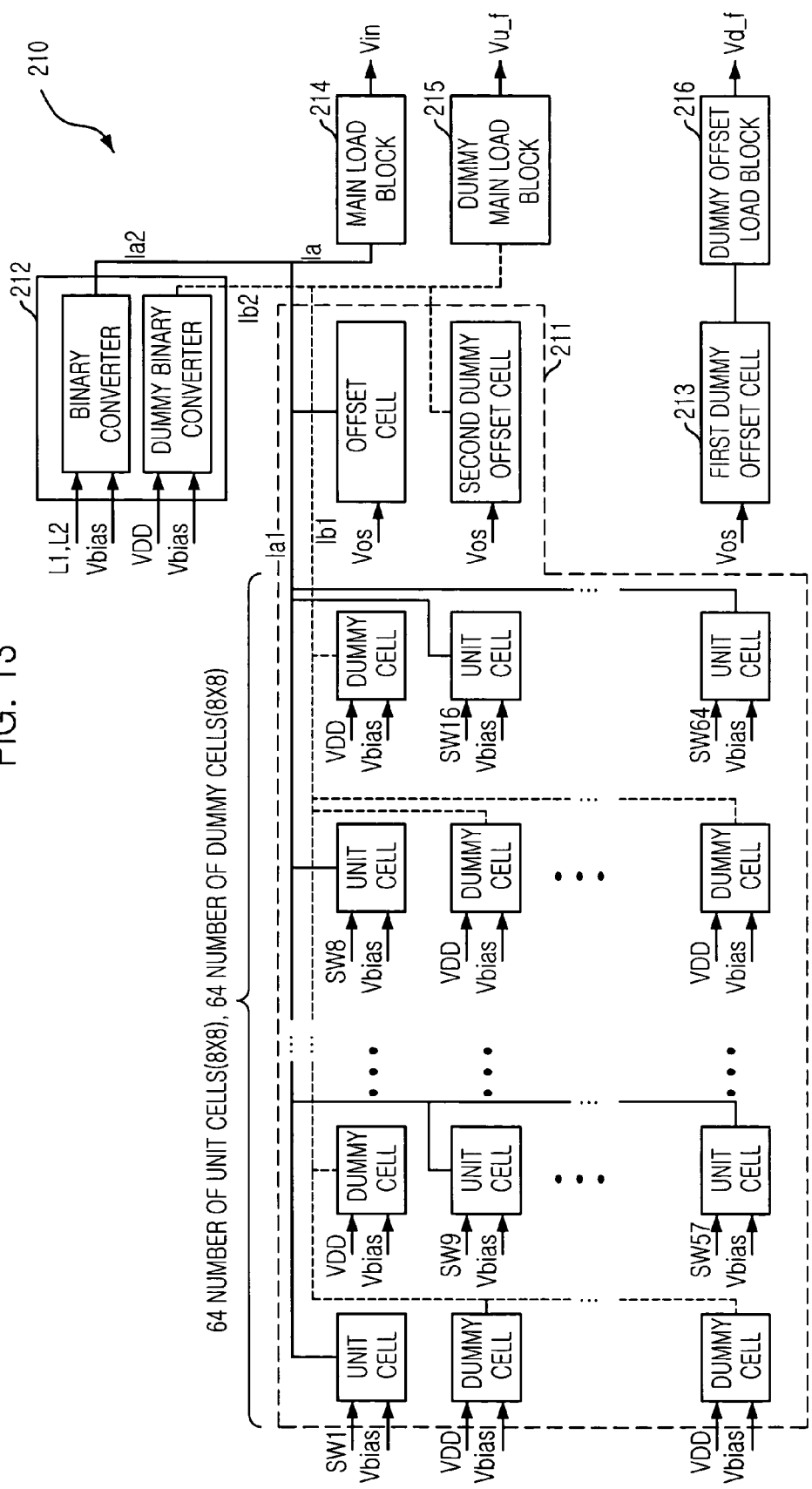
FIG. 13 is a block diagram describing a segment digital to analog converter included in the digital to analog converting block shown in FIG. 12.

FIG. 13 is a block diagram describing the segment digital to analog converter 211 included in the digital to analog converting block 210 shown in FIG. 12.

As shown, the segment digital to analog converter 211 includes a plurality of unit cells, an offset cell, a plurality of dummy cells and a second dummy offset cell. Herein, the number of unit cells depends on the number of bits of the thermometric code. Namely, as shown in FIG. 12, if the thermometric code is 64-bit, the number of unit cells is 64 and the number of dummy cells is 64 because the number of unit cells is same to that of dummy cells.

Each unit cell included in the segment digital to analog converter 211 is for outputting a predetermined current in response to each bit of the thermometric code; and total current outputted from each unit cell in response to each bit of the thermometric code is the first analog current Ia1. Also, a binary converter included in the binary digital to analog converter 212 receives the bias voltage Vbias and the 2-bit dummy digital code L1 and L2; and outputs the second analog current Ia2 to the main load block 214. Thus, because the temperature range voltage Vin, which is outputted from the main load block 214, depends on the bias voltage Vbias and the offset voltage Vos, the digital to analog converting block 210 can accurately generate the temperature range voltage Vin.

Also, total amount of currents outputted from the plurality of unit cells is equivalent to that of currents outputted from the plurality of dummy cells. Namely, though each unit cell outputs a predetermined current to the main load block 214 in response to each bit, e.g., SW1, of the thermometric code, the plurality of dummy cells respectively outputs a predetermined current to the dummy main load block 215 after the bias voltage Vbias and the offset voltage Vos are supplied to the digital to analog converting block 210. As a result, the dummy main load block 215 receives the second analog current Ia2, i.e., total currents outputted from the plurality of dummy cells and the second dummy offset cell, and, then, can generate the feedback high voltage Vu_f, i.e., a voltage corresponding to the maximum sensible temperature. In addition, in response to the bias voltage Vbias, a dummy binary converter included in the binary digital to analog converter 212 outputs the second analog current Ia2 to the main load block 214. Thus, because the feedback high voltage Vu_f, which is outputted from the dummy main load block 215, depends on the bias voltage Vbias and the offset voltage Vos, the digital to analog converting block 210 can accurately generate the feedback high voltage Vu_f.

Moreover, the first dummy offset cell 212 receives the offset voltage Vos and outputs a predetermined current in response to the offset voltage Vos. Then, the dummy offset load block 216 can accurately generate the feedback low voltage Vd_f based on the predetermined current outputted from the first dummy offset cell 212.

Figure 14A:
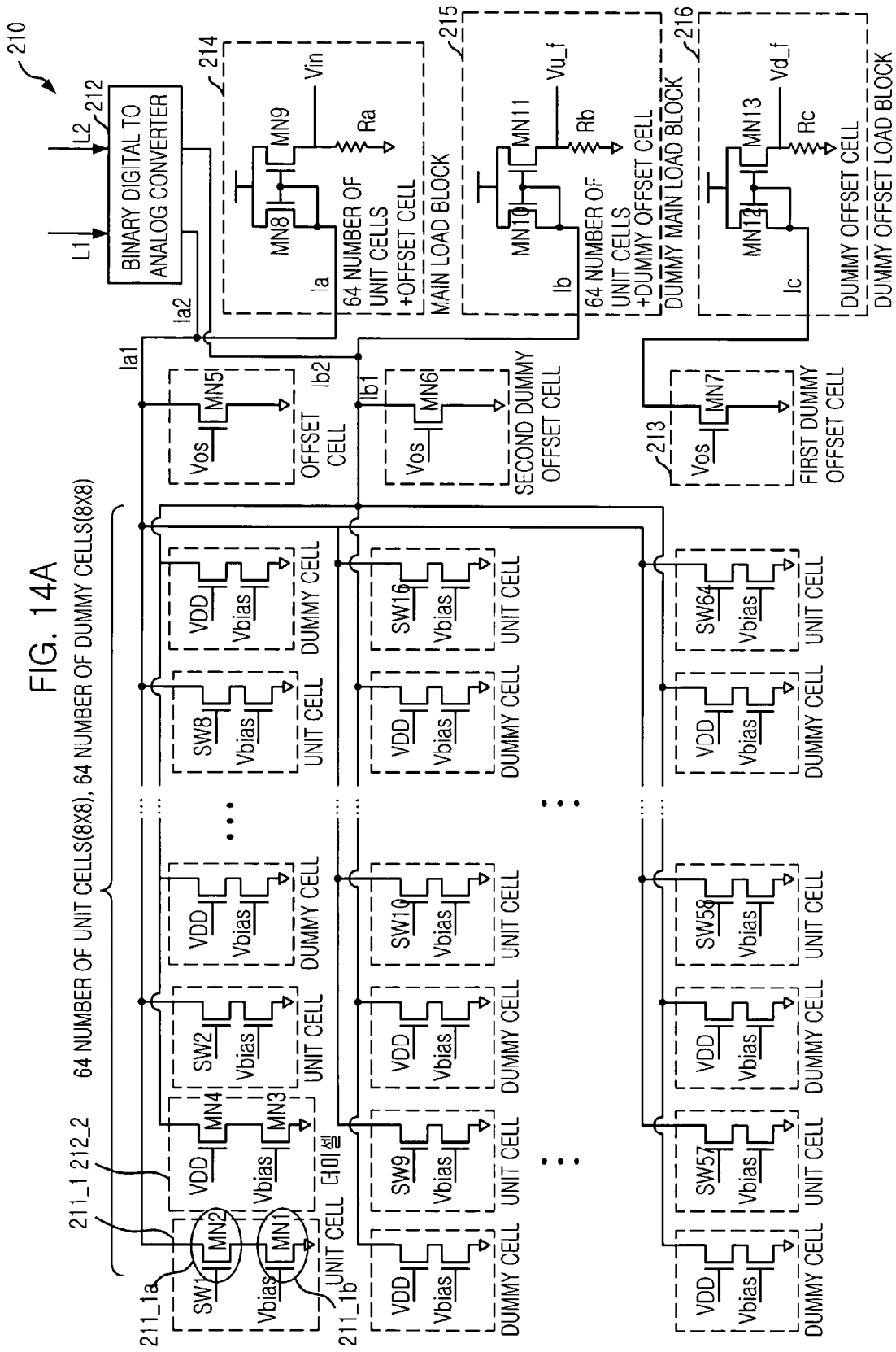
FIG. 14A is a schematic diagram depicting the segment digital to analog converter, a main load block, a dummy main load block, a first dummy offset cell and a dummy offset load block shown in FIG. 13.
Figure 14B:
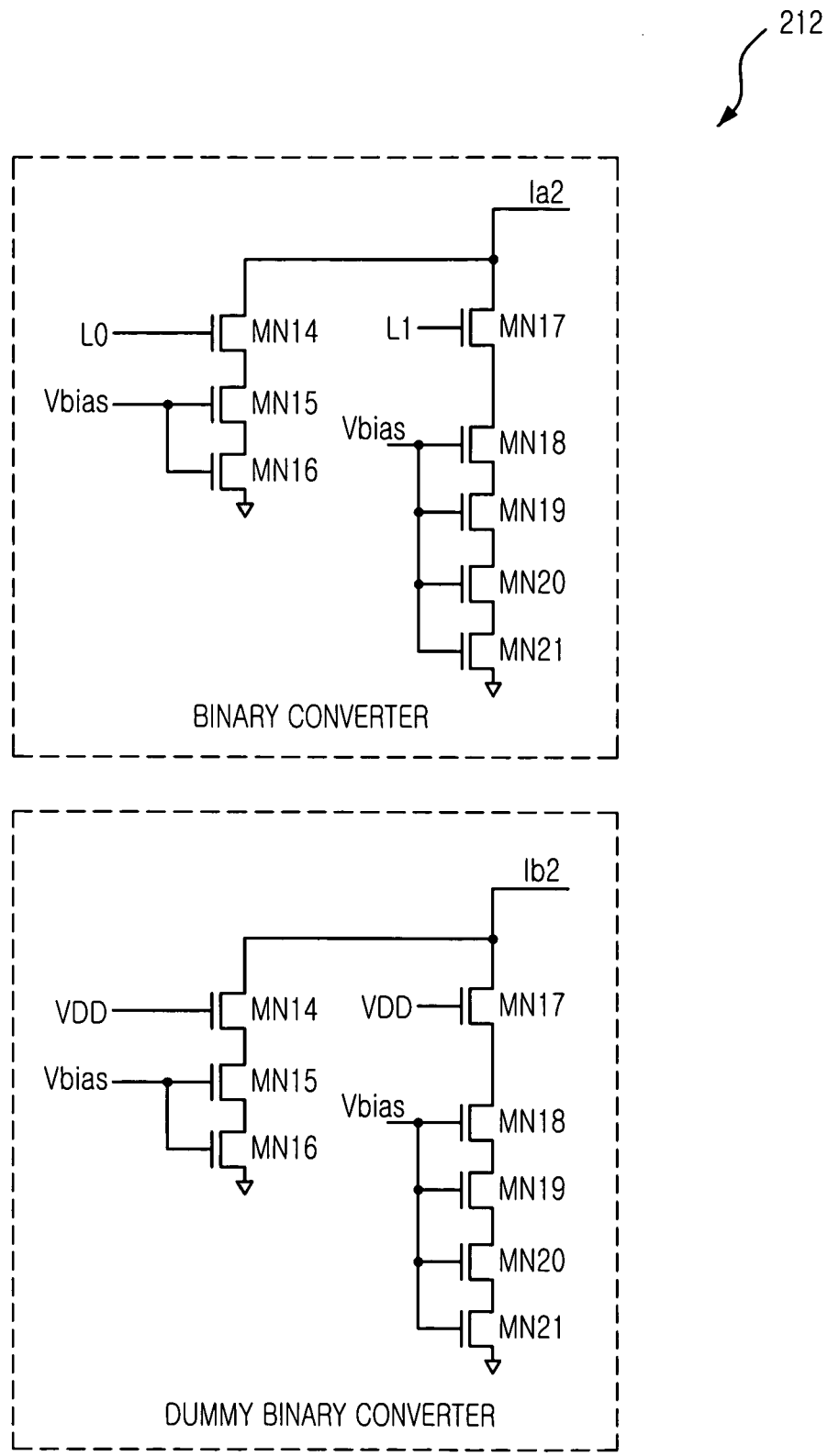
FIG. 14B is a schematic diagram depicting a binary digital to analog converter shown in FIG. 13.

FIG. 14A is a schematic diagram depicting the segment digital to analog converter 211, the main load block 214, the dummy main load block 215, the first dummy offset cell 213 and the dummy offset load block 216 shown in FIG. 13. Also, FIG. 14B is a schematic diagram depicting the binary digital to analog converter 212 shown in FIG. 13.

Referring to FIG. 14A, each unit cell includes two MOS transistors, e.g., MN1 and MN2, wherein each gate of two MOS transistors receives one bit of the thermometric code and the bias voltage Vbias. Contrary to each unit cell, each dummy cell includes two MOS transistors, e.g., MN3 and MN4, wherein each gate of two MOS transistors receives the supply voltage VDD and the bias voltage Vbias.

The offset cell, the second dummy offset cell and the first dummy offset cell 213 respectively includes one MOS transistor, e.g., MN5, wherein a gate of the MOS transistor is coupled to the offset voltage Vos.

Also, referring to FIG. 14A, each of the main load block 214, the dummy main load block 215 and dummy offset load block 216 includes a current mirror which is constituted with two MOS transistors. Namely, the main load block 214 mirrors an analog currents, i.e., Ia=Ia1+Ia2, and generates the temperature range voltage Vin by using a resister Ra. Likewise, the dummy main load block 215 and the dummy offset load block 216 respectively mirrors a dummy analog current, i.e., Ib=Ib1+Ib2, and the dummy offset current Ic; and then respectively generates the feedback high voltage Vu_f by using a resister Rb and the feedback low voltage Vd_f by using a resister Rc.

In detail, in each current mirror, one MOS transistor, e.g., MN8, is diode-connected; and the other MOS transistor, e.g., MN9 has a gate, a source and a drain, wherein the gate is coupled to a gate of the one MOS transistor, e.g., MN8, the source is coupled to the supply voltage and the drain is coupled to one side of the resistor, e.g., Ra. The other side of the resistor, e.g., Ra is coupled to the ground VSS.

Referring to FIG. 14B, the binary converter included in the binary digital to analog converter 212 includes a plurality of MOS transistors. Among three MOS transistors MN14 to MN16 serially connected, one MOS transistor MN14 receives a first bit, e.g., L0, of the 2-bit dummy digital code at its gate and the others MN15 and MN16 receive the bias voltage Vbias at their gate. Also, five MOS transistors MN17 to MN21 are included in the binary converter. Among the five MOS transistors, one MOS transistor MN17 is coupled to a second bit, e.g., L1, of the 2-bit dummy digital code at its gate and the others MN18 to MN21 receive the bias voltage Vbias at their gate. Herein, currents outputted from each group, i.e., MN14 to MN16 and MN17 to MN21, is summed as the second analog current Ia2.

As shown in FIG. 14B, the dummy binary converter has the same structure to the binary converter. Contrary to the binary converter, two MOS transistors, e.g., MN14 and MN17, included in the dummy binary converter receive the supply voltage VDD at their gate. Thus, detailed description about the dummy binary converter is omitted herein.

Figure 15:
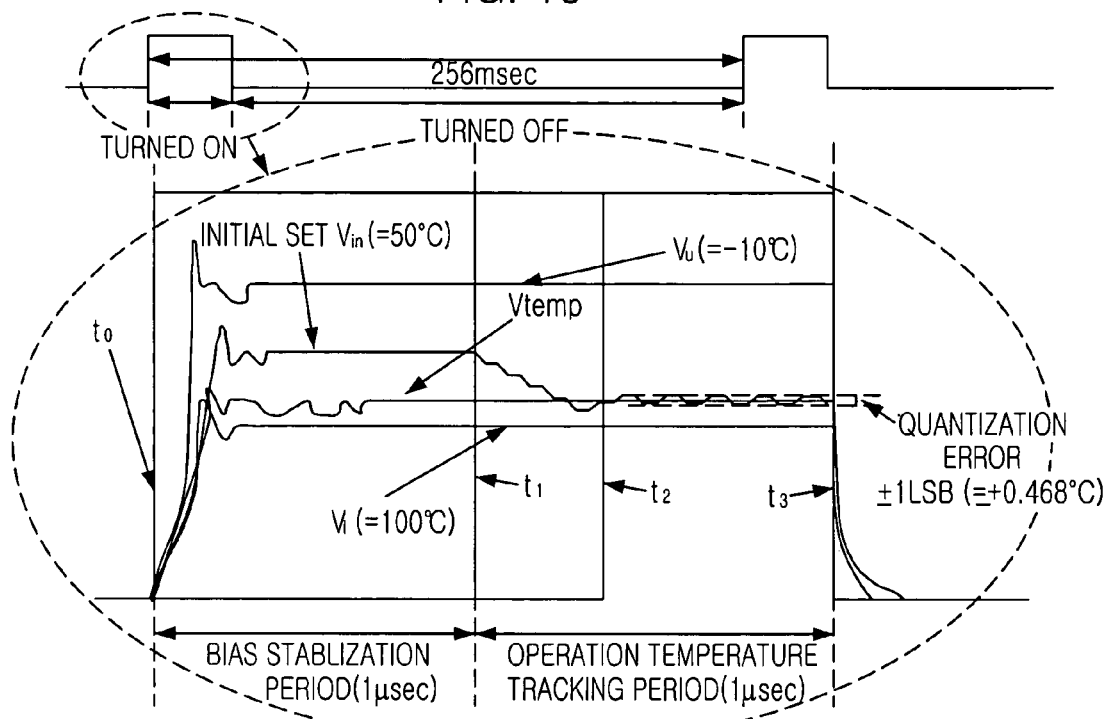
FIG. 15 is a waveform demonstrating an operation of the digital to analog converting block shown in FIG. 12.

FIG. 15 is a waveform demonstrating an operation of the digital to analog converting block 210 shown in FIG. 12. Referring to FIGS. 12 to 15, the operation of the digital to analog converting block 210 is described in detail.

Generally, there are several types of the digital to analog converting block 210: a dual-slope analog to digital converter, a tracking analog to digital converter, a flash analog to digital converter, a sigma-delta analog to digital converter and the like. Particularly, in the present invention, the tracking analog to digital converter is used because of limitations about a size of the semiconductor memory device, a supply power and the like.

Though the tracking analog to digital converter has the disadvantage of very narrow bandwidth, a wide bandwidth and a high operation speed are not essential and necessary in the present invention because the temperature is not rapidly changed in the semiconductor memory device. Probably, a high resolution is demanded. Thus, the tracking analog to digital converter is suitable because it can achieve a high resolution even if its size is small and the supply power is not enough.

First of all, the voltage comparator 250 compares the temperature detection voltage Vtemp with the temperature range voltage Vin to thereby output one of the count up signal CNT_UP and the count down signal CNT-DN. Herein, the voltage comparator 250 is a kind of rail-to-rail input comparator which can accurately compare two inputted voltages, i.e., the temperature detection voltage Vtemp and the temperature range voltage Vin, in a range from the ground VSS to the supply voltage VDD. Also, the temperature detection voltage Vtemp has a predetermined voltage level in response to a present temperature; and the temperature range voltage Vin has a predetermined voltage level in response to a preceding temperature. Herein, the temperature range voltage Vin can be set in response to the preceding temperature by using the register 270 latching a preceding 8-bit digital control code.

In response to the count up signal CNT_UP and the count down signal CNT-DN outputted from the voltage comparator 250, the binary 8-bit counter 220 increases or decreases the preceding 8-bit digital control code latched in the register 270.

Then, the code converter 230 receives the 6-bit code of the digital control code outputted from the binary 8-bit counter 220; and converts the 6-bit code into the thermometric code. The other, i.e., 2-bit code, of the digital control code is inputted to the dummy converter 240. During duration of converting the 6-bit code into the thermometric code in the code converter 230, the dummy converter 240 receives the 2-bit code and delays the 2-bit code by a predetermined amount to thereby output as a 2-bit dummy digital code L1 and L2.

Table 1 shows a preferable example about a code conversion in the code converter 230. Herein, in the table 1, how to convert a 3-bit digital code into a 7-bit thermometric code is described in detail.

TABLE 1

CODE CONVERSION IN CODE CONVERTER

| 3-bit digital code | | | 7-bit thermometric code | | | | | | |
|---|---|---|---|---|---|---|---|---|---|
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

Referring to FIG. 12, in the present invention, the thermometric code should be 64-bit because the code converter receives the 6-bit code outputted from the binary 8-bit counter 220.

Herein, if a thermometric code based on the 8-bit digital control code outputted from the binary 8-bit code is converted into an analog voltage, the segment digital to analog converter 211 shown in FIG. 12 becomes very complicated and complex because the segment digital to analog converter 211 should include a lot of circuit components, e.g., transistors, for converting a digital code into an analog voltage. However, actually, the temperature is not rapidly changed; and, thus, one bit of the thermometric code in response to the temperature is usually changed at once. As a result, by using the thermometric code outputted from the code converter 230, a glitch occurred if the 6-bit digital control code outputted from the binary 8-bit counter 220 is directly converted into the first analog voltage Ia1 is prevented.

In addition, referring to FIG. 12, the 6-bit code of the digital control code outputted from the binary 8-bit counter 220 is converted into the first analog current Ia1 by using the thermometric code conversion; and the other, i.e., the 2-bit code, of the digital control code is converted into the second analog current Ia2 by not using the thermometric code conversion. It is because the present invention takes the advantage of the thermometric code and overcomes the disadvantage of the thermometric code. Namely, in the present invention, the glitch is prevented and a bandwidth becomes wider. Also, a size of the code converter 230 can be reduced.

On and on, in the digital to analog converting block 210, the segment digital to analog converter 211 receives the 64-bit thermometric code and outputs the first analog current Ia1 to the main load block 214. Also, the binary digital to analog converter 212 receives the 2-bit dummy digital code outputted from the dummy converter 240 and outputs the second analog current Ia2 to the main load block 214.

Then, the main load block 214 generates the temperature range voltage Vin in response to the first and second analog currents Ia1 and Ia2. The temperature range voltage Vin is inputted to the voltage comparator 250; and the voltage comparator 250 compares the temperature detection voltage Vtemp with the temperature range voltage Vin to thereby output the count up signal CNT-UP and the count down signal CNT-DN to the binary to 8-bit counter 220. Herein, if the 8-bit digital control code outputted from the binary 8-bit counter is changed, the register 270 is updated.

Referring to FIG. 5, the refresh controller 400 receives the 8-bit digital control code outputted from the binary 8-bit counter in order to control a refresh cycle by using the refresh reference signal Ref.

Furthermore, in the digital to analog converting block 210, the segment digital to analog converter 211 outputs the first dummy analog current Ib1 to the dummy main load block 215; and the binary digital to analog converter 212 outputs the dummy second dummy analog current Ib2 to the dummy main load block 215. Then, the dummy main load block 215 generates the feedback high voltage Vu_f. Herein, the feedback high voltage Vu_f is outputted based on the dummy analog current Ib, i.e., Ib=Ib1+Ib2. Namely, the feedback high voltage Vu_f is the same to the temperature range voltage Vin outputted if all unit cells are turned on, i.e., the 8-bit digital control code has the maximum value. As above described, the feedback high voltage Vu_f is used for compensating and adjusting a voltage level of the bias voltage Vbias outputted from the temperature detection block 100.

Also, in the segment digital to analog converting block 210, each dummy cell is the same to each unit cell; and the plurality of dummy cells and unit cells are arranged with each other in common centroid method, i.e., each dummy cell and each unit cell are horizontally and vertically arranged in turns. As a result, without any influence of a manufacturing process, each dummy cell and each unit cell can respectively generates the same currents in response to the bias voltage Vbias.

Moreover, the dummy offset load block 216 generates the feedback low voltage Vd_f in response to the dummy offset current Ic outputted from the first dummy offset cell 213. Herein, the dummy offset current Ic is the same to a current outputted from the second dummy offset cell included in the segment digital to analog converter 211. Namely, the dummy offset current Ic is the same to the analog current Ia if the first analog current Ia1 is 0, i.e., all unit cells are turned off. As a result, the feedback low voltage Vd_f can cope with the minimum digital control code outputted from the binary 8-bit counter, i.e., the minimum sensible temperature. The feedback low voltage Vd_f is inputted to the temperature detection block 100 and used for compensating and adjusting the offset voltage Vos.

As above described, in the present invention, the analog to digital converter 200 uses the bias voltage Vbias and the offset voltage Vos, which are outputted from the temperature detection block 100, for converting the temperature detection voltage Vtemp into the digital control code. Also, the temperature detection block 100 uses the feedback high voltage Vu_f and the feedback low voltage Vd_f for compensating and adjusting the bias voltage Vbias and the offset voltage Vos. Thus, though the temperature detection voltage Vtemp have any influence of the manufacturing process and the supply power, the digital control code outputted from the analog to digital converter 200 can accurately correspond to the temperature variation.

Typically, for outputting the constant bias voltage and current after receiving the supply power, the semiconductor device uses a current mirror. Particularly, for obtaining a big gain, the current mirror has a cascade or triple cascade type circuit. However, because the supply power supplying to the semiconductor device is very low and a threshold voltage of each MOS transistor used in the semiconductor device is relatively high, it is difficult to employ the cascade or triple cascade type circuit in the semiconductor device. Also, the cascade or triple cascade type circuit can have an error, e.g., mismatch between the digital control code and the sensed temperature, because cascade or triple cascade type circuit has a lot of influences from a current variation of the semiconductor device generated by the manufacturing process condition, e.g., a difference between current variations of the temperature detection block 100 and the analog to digital converter 200.

Therefore, the present invention uses a feedback bias circuit in which the feedback high voltage Vu_f and the feedback low voltage Vd_f outputted to the temperature detection block 100 are used for compensating and adjusting the bias voltage Vbias and the offset voltage Vos outputted to the analog to digital converter 200. Because of the feedback bias circuit, the present invention can obtain the digital control code which accurately corresponds to the sensed temperature and does not have any influence of the manufacturing process condition and the supply power.

Namely, in the present invention, if the refresh cycle is controlled based on the digital control code, the semiconductor memory device can dramatically reduce a power consumption because the digital control code accurately reflect the sensed temperature.

Continuously referring to FIG. 15, assuming that a cycle of refresh operation is 256 msec, the temperature detection block 100 is enabled during a predetermined short time. As above described, in response to the detection control signal Sen, the enable block 160 supplies the operation voltage Vop to the reference voltage generator 110, the bias voltage generator 120 and the detection signal generator 130 at a first timing $t_0$.

Then, at a second timing $t_1$, the reference voltage generator 110 outputs the reference voltage Vref to the detection signal generator 130; and the bias voltage generator 120 generates the up and down dividend voltages Vu and Vd. In the analog to digital converter 200, the voltage comparator 250 starts to compare the temperature detection voltage Vtemp with the temperature range voltage Vin. The voltage comparator 250 continuously compares the temperature detection voltage Vtemp with the temperature range voltage Vin until a voltage level of the temperature detection voltage Vtemp is same to that of the temperature range voltage Vin.

At a third timing $t_2$, i.e., when the voltage level of the temperature detection voltage Vtemp is same to that of the temperature range voltage Vin, the refresh controller 400 adjusts a refresh cycle in response to the digital control code latched in the register 270. Then, after controlling the refresh cycle, the analog to digital converter 200 is disabled.

Figure 16:
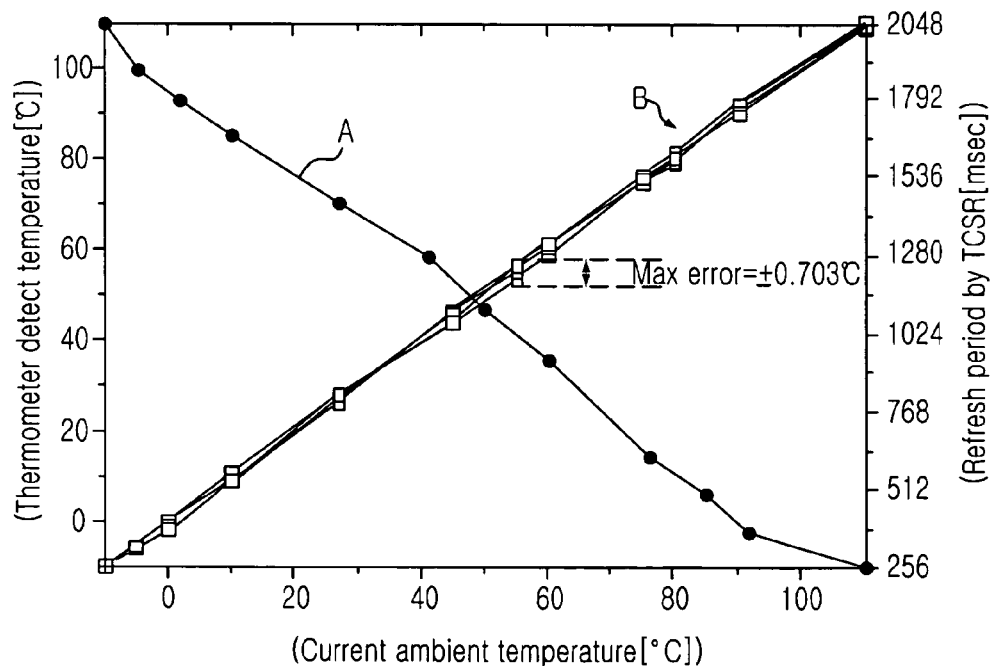
FIG. 16 is a graph demonstrating a simulation result of the present invention.

FIG. 16 is a graph demonstrating a simulation result of the present invention.

As shown, in the graph, a line A shows a variation of the refresh cycle in response to the temperature variation; a line B describes a thermometer detect temperature, i.e., the temperature sensed by the temperature detection block 100, based on a current ambient temperature.

Referring to FIG. 16, in the present invention, a range of a sensible temperature by the temperature detection block 100 is from about −10° C. to about 110° C. Also, the up dividend voltage Vu and the down dividend voltage Vd are varied in about 3.1 mV according to the current ambient temperature.

In a duration of enabling the temperature detection block 100, an average consumed current is ⅓ mA. Also, when the supply voltage is from about 1.6 V to about 3.3 V, the thermometer detect temperature has an error range, wherein the error range is a maximum 1.4° C. under manufacturing process. As a result, though the operation amplifier, e.g., op_amp1, included in the temperature detection block 100, has an offset voltage, i.e., a maximum about 10 mV, and a DC offset voltage, e.g., a maximum about 20 mV, is needed for generating a threshold voltage, the temperature detection block 100 of the present invention can detect the current ambient temperature with a maximum 5° C. error range.

Finally, the present invention can more accurately detect the current ambient temperature than the prior art does and the refresh cycle is more optimized. As a result, the present invention can more dramatically reduce a power consumption than the prior art does.

Figure 17:
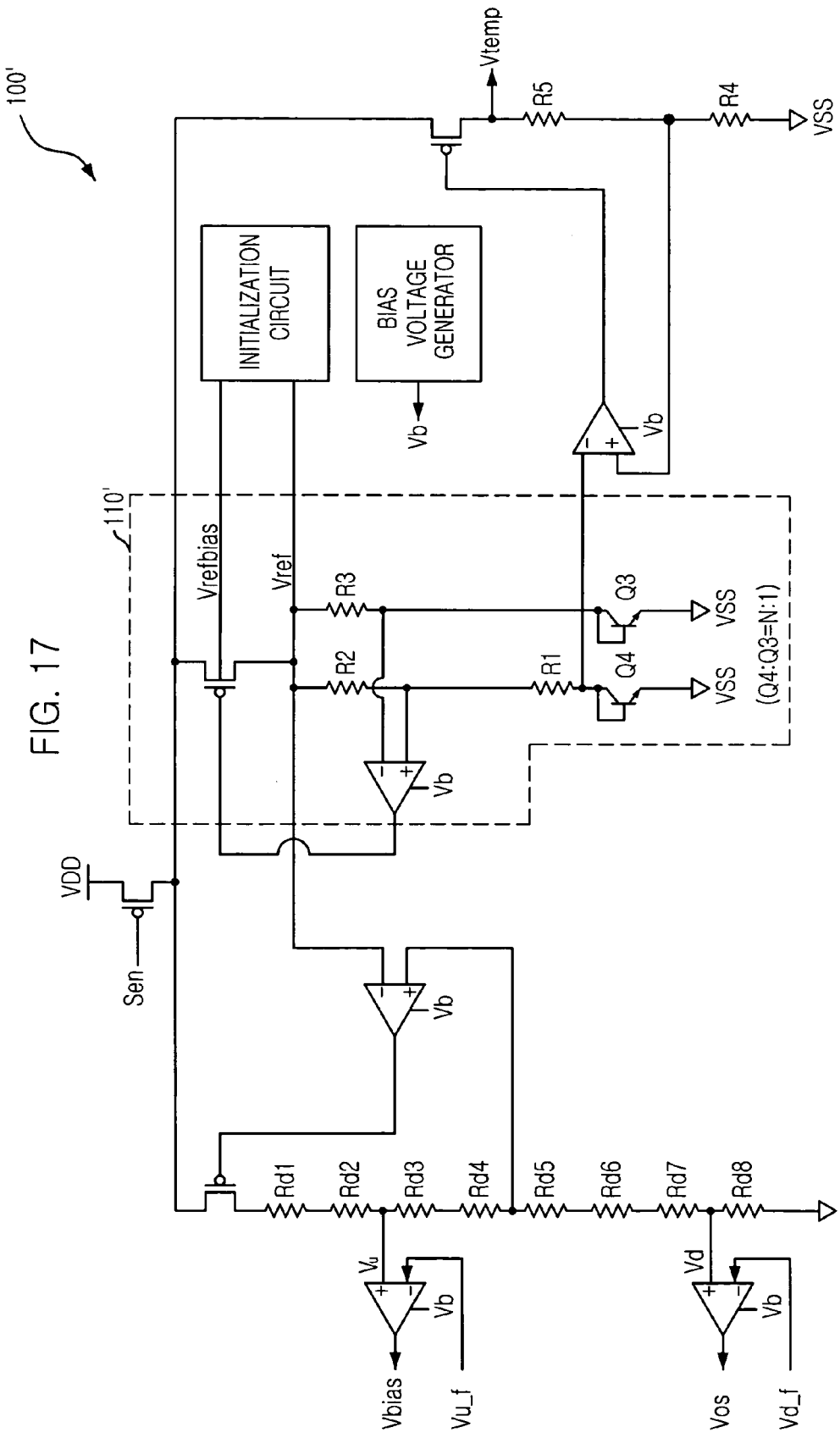
FIG. 17 is a block diagram describing a temperature detection block in accordance with the other embodiment of the present invention.

FIG. 17 is a block diagram describing a temperature detection block 100' in accordance with the other embodiment of the present invention.

As shown, the temperature detection block 100' is similar to the temperature detection block 100 shown in FIG. 7. However, the temperature detection block 100' includes two NPN bipolar transistors Q3 and Q4. Herein, detailed description about an operation and structure of the temperature detection block 100' is omitted because, except for a type of bipolar transistor used in each temperature detection block, both temperature detection blocks 100 and 100' is the same.

Therefore, in the present invention as above described, the refresh operation has the optimum refresh cycle according to the temperature variation. As a result, there is dramatically reduced the power consumption which is occurred by frequently performing unnecessary refresh operation.

Particularly, the semiconductor memory device in accordance with the present invention can reduce the power consumption because the refresh operation should be always carried out if the semiconductor memory device is turned on.

The present application contains subject matter related to Korean patent applications No. 2004-11063, filed in the Korean Patent Office on Feb. 19, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. An apparatus for controlling a refresh cycle in a semiconductor memory device, comprising:
    a temperature detection controller for generating a detection control signal and a converting control signal;
    a temperature detection block, which is enabled by the detection control signal, for generating an analog detection voltage in response to a temperature variation;
    an analog to digital converter, which is enabled by the converting control signal, for converting the analog detection voltage into a digital control code; and
    a refresh controller for generating a refresh cycle control signal based on the digital control code in order to control the refresh cycle.

2. The apparatus as recited in claim 1, wherein the detection control signal is activated during a first predetermined duration determined by a circumference condition or a user for sensing a temperature in the semiconductor memory device.

3. The apparatus as recited in claim 1, wherein the temperature detection block outputs a bias voltage and an offset voltage to the analog to digital converter, wherein the bias voltage and the offset voltage are used as references for converting the analog detection voltage into the digital control code in the analog to digital converter.

4. The apparatus as recited in claim 3, wherein the analog to digital converter converts predetermined bits of the digital control code into a thermometric code by using a code conversion and the other bits of the digital control code into a binary code.

5. The apparatus as recited in claim 4, wherein the analog to digital converter outputs a feedback high voltage in response to a maximum sensible temperature to the temperature detection block; and outputs a feedback low voltage in response to a minimum sensible temperature to the temperature detection block.

6. The apparatus as recited in claim 5, wherein the temperature detection block generates the bias voltage which is adjusted based on the feedback high voltage and the offset voltage which is adjusted based on the feedback low voltage.

7. The apparatus as recited in claim 1, wherein the temperature detection block includes:
    a reference voltage generator for generating a reference voltage which has a fixed level in a temperature variation and a process variation by using a characteristic of a junction between an emitter and a base of a bipolar transistor and a characteristic of a thermal voltage;
    a bias voltage generator for generating a bias voltage and an offset voltage used as references for converting the analog temperature voltage into the digital control code in the analog to digital converter;
    a detection signal generator for generating the analog temperature voltage by amplifying a voltage inputted from the reference voltage generator; and
    an enable block for enabling the bias voltage generator, the detection signal generator and the reference voltage generator in response to the detection control signal.

8. The apparatus as recited in claim 7, wherein the bias voltage generator generates the bias voltage which is adjusted based on a feedback high voltage and the offset voltage which is adjusted based on a feedback low voltage, wherein the feedback high voltage and the feedback low voltage are inputted from the analog to digital converter.

9. The apparatus as recited in claim 7, wherein the reference voltage generator includes:
    a first bipolar transistor having an emitter, a base and a collector, wherein the base connected to the collector is coupled to a ground VSS;
    a second bipolar transistor having an emitter, a base and a collector, wherein the base connected to the collector is coupled to a ground VSS;
    a first resistor coupled to the emitter of the second bipolar transistor;
    a second resistor coupled to the first resistor;
    a third resistor coupled to the emitter of the first bipolar transistor;
    a first operation amplifier for receiving two input voltages to thereby output a reference bias signal, wherein two inputted voltages are respectively inputted from a first node between the first and second resistors and a second node between the third resistor and the first bipolar transistor; and
    a second MOS transistor having a source, a gate and a drain, wherein the source is coupled to the enabling block and the gate receive the reference bias signal, wherein the reference voltage is inputted to a common node coupled to the second MOS transistor, the second resistor and the third resistor.

10. The apparatus as recited in claim 9, wherein the temperature detection block further includes an initialization circuit for increasing a voltage level of the reference voltage over a predetermined level.

11. The apparatus as recited in claim 9, wherein the detection signal generator includes:
    a fourth resistor coupled to the ground;

a third MOS transistor having a source, a gate and a drain, wherein the source is coupled to the enabling block;
a fifth resistor coupled between the fourth resistor and the drain of the third MOS transistor; and
a second operation amplifier for receiving two input voltages to thereby output a resultant voltage to the gate of the third MOS transistor, wherein two inputted voltages are respectively inputted from a third node between the first resistor and the second bipolar transistor and a fourth node between the fourth resistor and the fifth bipolar transistor.

12. The apparatus as recited in claim 11, wherein the bias voltage generator includes:
a voltage dividing block for generating a middle dividend voltage, a up dividend voltage and a down dividend voltage;
a voltage supplier for supplying a voltage to the voltage dividing block;
a third operation amplifier for receiving the middle dividend voltage and the reference voltage to output a resultant signal to the voltage supplier;
a fourth operation amplifier for receiving the up dividend voltage and the feedback high voltage to thereby adjust the bias voltage; and
a fifth operation amplifier for receiving the down dividend voltage and the feedback low voltage to thereby adjust the offset voltage.

13. The apparatus as recited in claim 12, wherein the voltage supplier includes a first MOS transistor having a source, a gate and a drain, wherein the source is coupled to the enabling block and the drain is coupled to the voltage dividing block.

14. The apparatus as recited in claim 12, wherein the voltage dividing block has a plurality of resistor serially connected to each other.

15. The apparatus as recited in claim 14, wherein the enabling block includes a fourth MOS transistor having a source, a gate and a drain, wherein the source is coupled to a power voltage; the gate receives the detection control signal; and the drain is for outputting an operation voltage to the bias voltage generator, the detection signal generator and the reference voltage generator.

16. The apparatus as recited in claim 7, wherein the analog to digital converter includes:
a voltage comparator for comparing the analog temperature detection voltage with a temperature range voltage;
a binary 8-bit counter for controlling the digital control signal according to above comparison result of the voltage comparator;
a code converter for converting predetermined bits of the digital control signal into a thermometric code;
a dummy converter for converting the other bits of the digital control signal into a 2-bit digital code; and
a digital to analog converting block for receiving the thermometric code and the 2-bit digital code to thereby output the temperature range voltage, the feedback high voltage and the feedback low voltage.

17. The apparatus as recited in claim 16, wherein the digital to analog converting block includes:
a segment digital to analog converter for receiving the thermometric code outputted from the code converter and generating a first analog current and a first dummy analog current;
a binary digital to analog converter for receiving the 2-bit digital code and generating a second analog current and a second dummy analog current;
a main load block for receiving the first and second analog currents to thereby output the temperature range voltage;
a dummy main load block for receiving the first and second dummy analog currents to thereby output the feedback high voltage;
a first dummy offset cell for generating a dummy offset current in response to the offset voltage; and
a dummy offset load block for generating the feedback low voltage Vd_f based on the dummy offset current.

18. The apparatus as recited in claim 17, wherein the first dummy offset cell includes a MOS transistor having a gate for receiving the bias voltage.

19. The apparatus as recited in claim 16, wherein the segment digital to analog converter includes:
a plurality of unit cells, each for generating a predetermined current in response to each bit of the thermometric code;
an offset cell for generating a offset current in response to the offset voltage;
a plurality of dummy cells, each for generating a current which has the same amount of the predetermined current outputted from each unit cell; and
a second dummy offset cell for generating a current, which has the same amount to the offset current, in response to the offset voltage,
wherein the number of unit cells depends on the number of bits of the thermometric code.

20. The apparatus as recited in claim 19, wherein the unit cell includes:
a switch turned on in response to one bit of the thermometric code; and
a current source coupled to the switch for generating the predetermined current in response to the bias voltage.

21. The apparatus as recited in claim 20, wherein the switch is a MOS transistor having a gate for receiving one bit of the thermometric code.

22. The apparatus as recited in claim 19, wherein the current source includes a MOS transistor having a gate for receiving the bias voltage.

23. The apparatus as recited in claim 19, wherein the dummy cell includes:
a switch having a MOS transistor always turned on; and
a current source coupled to the switch for generating the predetermined current in response to the bias voltage, wherein the current source includes a MOS transistor having a gate for receiving the bias voltage.

24. The apparatus as recited in claim 19, wherein the offset cell includes a MOS transistor having a gate for receiving the bias voltage.

25. The apparatus as recited in claim 19, wherein the offset cell includes a MOS transistor having a gate for receiving the bias voltage.

26. The apparatus as recited in claim 19, wherein the second dummy offset cell includes a MOS transistor having a gate for receiving the bias voltage.

27. The apparatus as recited in claim 17, wherein the main load block includes:
a first transistor having a gate, a drain and a source, wherein the drain and the gate are diode-connected and the source receives a supply voltage;
a second transistor having a gate, a drain and a source, wherein the gate is coupled to the gate of the first transistor and the source receives a supply voltage; and
a resistor coupled to the drain of the second transistor, wherein the temperature range voltage is outputted between the second transistor and the resistor.

28. The apparatus as recited in claim 17, wherein the dummy main load block includes:
  a first transistor having a gate, a drain and a source, wherein the drain and the gate are diode-connected and the source receives a supply voltage;
  a second transistor having a gate, a drain and a source, wherein the gate is coupled to the gate of the first transistor and the source receives a supply voltage; and
  a resistor coupled to the drain of the second transistor, wherein the feedback high voltage is outputted between the second transistor and the resistor.

29. The apparatus as recited in claim 17, wherein the dummy offset load block includes:
  a first transistor having a gate, a drain and a source, wherein the drain and the gate are diode-connected and the source receives a supply voltage;
  a second transistor having a gate, a drain and a source, wherein the gate is coupled to the gate of the first transistor and the source receives a supply voltage; and
  a resistor coupled to the drain of the second transistor, wherein the feedback low voltage is outputted between the second transistor and the resistor.

30. The apparatus as recited in claim 16, wherein the analog to digital converter further includes a pulse generator for generating a control pulse in order to determine an operation period of the voltage comparator.

31. The apparatus as recited in claim 30, wherein the analog to digital converter further includes a delay block 290 for delaying the control pulse until the voltage comparator outputs a resultant signal to the binary 8-bit counter.

32. The apparatus as recited in claim 16, wherein the analog to digital converter further includes a register for latching the thermometric code outputted from the binary 8-bit counter.

33. A method for controlling a refresh cycle in response to a temperature variation, comprising steps of:
  a) performing a refresh operation in response to a refresh control signal having a first period;
  b) sensing a temperature and generating an analog voltage based on the sensed temperature;
  c) converting the analog voltage into an N-bit digital control code;
  d) changing the first period of the refresh control signal into a second period in response to the N-bit digital control code; and
  e) performing the refresh operation in response to the refresh control signal having the second period.

34. The method as recited in claim 33, further comprising the step of f) generating a bias voltage and an offset voltage for converting the analog voltage into an N-bit digital control code.

35. The method as recited in claim 34, wherein the step c) includes the steps of:
  c-1) comparing the analog voltage with a range voltage;
  c-2) counting up or down the N-bit digital control code based on the comparison result;
  c-3) converting a M-bit of the N-bit digital control code into a thermometric code and the other bits of the N-bit digital control code into a binary code; and
  c-4) converting the thermometric code and the binary code into the range voltage by using the bias voltage and the offset voltage.

36. The method as recited in claim 35, further includes the steps of:
  c-5) converting the thermometric code and the binary code into a feedback high voltage by using the bias voltage and the offset voltage;
  c-6) generating a feedback low voltage by using the bias voltage; and
  c-7) compensating the bias voltage and the offset voltage by using the feedback high voltage and the feedback low voltage,
  wherein the feedback high voltage and the feedback low voltage respectively mean a maximum sensible temperature and a minimum sensible temperature.

37. The method as recited in claim 35, further includes the step of c-8) latching the N-bit digital control code.

* * * * *